US012696755B2

(12) United States Patent
Wakisaka et al.

(10) Patent No.: US 12,696,755 B2
(45) Date of Patent: Jul. 28, 2026

(54) SEMICONDUCTOR DEVICE AND METHOD OF MANUFACTURING THE SAME

(71) Applicant: AOI ELECTRONICS CO., LTD., Takamatsu (JP)

(72) Inventors: Shinji Wakisaka, Tokyo (JP); Masato Fukushima, Tokyo (JP); Takayuki Hiroishi, Tokyo (JP)

(73) Assignee: AOI ELECTRONICS CO., LTD., Kagawa (JP)

( * ) Notice: Subject to any disclaimer, the term of this patent is extended or adjusted under 35 U.S.C. 154(b) by 383 days.

(21) Appl. No.: 18/293,585

(22) PCT Filed: Apr. 27, 2022

(86) PCT No.: PCT/JP2022/019195
§ 371 (c)(1),
(2) Date: Jan. 30, 2024

(87) PCT Pub. No.: WO2023/013190
PCT Pub. Date: Feb. 9, 2023

(65) Prior Publication Data
US 2025/0112180 A1 Apr. 3, 2025

(30) Foreign Application Priority Data

Aug. 5, 2021 (JP) ................................. 2021-128912

(51) Int. Cl.
H10W 20/41 (2026.01)
H10W 70/05 (2026.01)
(Continued)

(52) U.S. Cl.
CPC .......... H10W 20/435 (2026.01); H10W 70/05 (2026.01); H10W 70/60 (2026.01);
(Continued)

(58) Field of Classification Search
None
See application file for complete search history.

(56) References Cited

U.S. PATENT DOCUMENTS 6,501,169 B1 12/2002 Aoki et al.
2002/0017730 A1 2/2002 Tahara et al.
(Continued)

FOREIGN PATENT DOCUMENTS

JP 2001-156209 A 6/2001
JP 2003-188313 A 7/2003
(Continued)

OTHER PUBLICATIONS

International Search Report mailed on Jul. 19, 2022, in connection with corresponding International Application No. PCT/JP2022/019195 (5 pp., including machine-generated English translation).

*Primary Examiner* — Bradley Smith
(74) *Attorney, Agent, or Firm* — McCormick, Paulding & Huber PLLC

(57) ABSTRACT
A semiconductor wafer has a first pad electrode and a plurality of second pad electrodes formed on an upper surface thereof. A first opening and a plurality of second openings are formed in an insulating film covering the first pad electrode and the plurality of second pad electrodes. The first pad electrode is electrically connected to a first redistribution wiring in the first opening, and the plurality of second pad electrodes are electrically connected to a second redistribution wiring in the plurality of second openings. The first redistribution wiring has a narrow region and a wide region, a first columnar electrode is formed on the wide region, and a second columnar electrode is formed on the first columnar electrode. A third redistribution wiring is formed on the second redistribution wiring, and a plurality of third columnar electrodes are formed on the third redistribution wiring.

19 Claims, 20 Drawing Sheets

(51) Int. Cl.

| | |
|---|---|
| *H10W 70/60* | (2026.01) |
| *H10W 70/65* | (2026.01) |
| *H10W 70/652* | (2026.01) |
| *H10W 72/90* | (2026.01) |
| *H10W 74/00* | (2026.01) |
| *H10W 74/10* | (2026.01) |

(52) U.S. Cl.

CPC .......... *H10W 70/65* (2026.01); *H10W 70/652* (2026.01); *H10W 72/9445* (2026.01); *H10W 74/00* (2026.01); *H10W 74/10* (2026.01)

(56) References Cited

U.S. PATENT DOCUMENTS

| | | |
|---|---|---|
| 2003/0116867 A1 | 6/2003 | Nakamura et al. |
| 2004/0094841 A1 | 5/2004 | Matsuzaki et al. |
| 2008/0099930 A1 | 5/2008 | Terui |
| 2008/0237866 A1* | 10/2008 | Wang ..................... H10B 53/30 |
| | | 257/E23.141 |
| 2011/0001238 A1 | 1/2011 | Wakisaka et al. |
| 2019/0164918 A1 | 5/2019 | Shindo |
| 2025/0300026 A1* | 9/2025 | Wakisaka ................. G01K 7/16 |

FOREIGN PATENT DOCUMENTS

| | | |
|---|---|---|
| JP | 3540729 B2 | 7/2004 |
| JP | 2008-112776 A | 5/2008 |
| JP | 4232576 B2 | 3/2009 |
| JP | 2011-114133 A | 6/2011 |
| JP | 2012-119444 A | 6/2012 |
| JP | 2012-186366 A | 9/2012 |
| JP | 2016-219655 A | 12/2016 |
| JP | 2019-102522 A | 6/2019 |
| KR | 20040041045 A | 5/2004 |
| KR | 20110003274 A | 1/2011 |

* cited by examiner

A–A CROSS SECTION

SEMICONDUCTOR DEVICE AND METHOD OF MANUFACTURING THE SAME

CROSS-REFERENCE TO RELATED APPLICATIONS

This application is a National Stage application of International Patent Application No. PCT/JP2022/019195, filed on Apr. 27, 2022, which claims priority to Japanese Patent Application No. 2021-128912, filed on Aug. 5, 2021, each of which is hereby incorporated by reference in its entirety.

TECHNICAL FIELD

The present invention relates to a semiconductor device and a method of manufacturing the same, and relates to, for example, a semiconductor device having a redistribution wiring and a method of manufacturing the same.

BACKGROUND

In recent years, due to demands for faster operation and size reduction of semiconductor devices, a technique of forming a wiring referred to as a redistribution wiring on a pad electrode, which is a part of a wiring of an uppermost layer of a multi-layer wiring layer on a semiconductor substrate, has been developed. The redistribution wiring is made of a material mainly consisting of copper and is formed by, for example, the plating method in order to reduce the wiring resistance. External connection terminals such as bump electrodes and solder balls are formed on a part of an upper surface of the redistribution wiring. In a semiconductor device in which the redistribution wiring is adopted, the external connection terminals can be arranged in a region different from the pad electrodes by laying out the redistribution wiring.

Patent Document 1 discloses a semiconductor device referred to as WLCSP (Wafer Level Chip Size Package). In Patent Document 1, a redistribution wiring is formed on a pad electrode, a ball electrode made of solder is formed on the redistribution wiring, and the redistribution wiring is sealed with a resin film.

In Patent Document 2, a redistribution wiring is formed on a pad electrode, a plurality of columnar electrodes are formed on the redistribution wiring, solder balls are formed on the plurality of columnar electrodes, and the redistribution wiring and the plurality of columnar electrodes are sealed with a sealing film made of resin.

In Patent Document 3, a wiring of an uppermost layer of a multi-layer wiring layer is composed of a thin lower-layer pattern and a thick upper-layer pattern. The wiring of the uppermost layer is covered with an insulating film, and an opening is formed in the insulating film in a region to be a pad electrode of the wiring of the uppermost layer. Then, a bump electrode is formed on the pad electrode exposed from the opening. In the wiring of the uppermost layer where a large current is required, the upper-layer pattern with a planar shape that is one size smaller than the lower-layer pattern is adopted, and in the wiring of the uppermost layer where miniaturization is intended, the upper-layer pattern with a planar shape that is almost the same as the bump electrode is adopted.

Patent Document 1: Japanese Unexamined Patent Application Publication No. 2003-188313
Patent Document 2: Japanese Patent No. 3540729

Patent Document 3: Japanese Patent No. 4232576

SUMMARY

Problems to be Solved by the Invention

Recently, in the semiconductor devices in which the redistribution wiring is adopted, there is a demand for a larger current to flow through the redistribution wiring for power supply voltage or ground voltage. Such a large current is, for example, 1 to 10 A. Here, the width of the general redistribution wiring in WLCSP is 10 to 50 μm, but the allowable current is limited to about 1 to 3 A if the thickness of the redistribution wiring is 5 to 10 μm.

In Patent Document 1, the thickness of the redistribution wiring is set to 0.01 to 8 μm. When the width of the redistribution wiring is set to 10 to 50 μm, the redistribution wiring is formed with the above thickness, and a current of 1 to 10 A is made to flow through the redistribution wiring, there are concerns about problems such as the heat generation exceeding the allowable temperature, the acceleration of electromigration, and the disconnection due to fusing. If the thickness of the redistribution wiring is set to 8 □m or more in order to increase the allowable current, the pitch between the redistribution wirings is likely to be narrower, so that short-circuit faults occur between the redistribution wirings during manufacturing. Therefore, it becomes difficult to miniaturize the redistribution wiring. On the other hand, if the pitch between the redistribution wirings is widened in order to increase the allowable current, there will be a shortage of the region for forming the necessary redistribution wirings.

In Patent Document 2, by providing a plurality of columnar electrodes on one redistribution wiring, the total resistance value of the columnar electrode portion can be reduced and the allowable current of the terminal portion can be increased. However, since Patent Document 2 is a technique of forming columnar electrodes only for the terminal portion, the allowable current is insufficient in the redistribution wiring where a large current flows.

Although Patent Document 3 does not describe specific dimensions, materials, and manufacturing methods, the case in which the technique disclosed in Patent Document 3 is applied to WLCSP will be examined below.

Photosensitive polyimide, which is commonly used in WLCSP, is used for the insulating film that covers the wiring of the uppermost layer. In that case, since the insulating film is strongly affected by the thickness of the redistribution wiring to be covered due to physical viscosity and stacking properties of the photosensitive polyimide, a large step difference will occur on the surface of the insulating film if the redistribution wiring has a large thickness. Therefore, it becomes difficult to completely cover the redistribution wiring layer. Therefore, in the general coating method, the thickness of the redistribution wiring to which a photosensitive polyimide film can be applied is up to about 10 μm, and it is not possible to cover the redistribution wiring having a thickness of 20 to 30 μm. In other words, such an insulating film can be applied only to the redistribution wiring having a thickness of less than 10 μm.

On the other hand, when a sealing resin such as an epoxy resin is used as the above insulating film, it is necessary to form an opening for connecting the external connection terminal and the redistribution wiring in the sealing resin after covering the redistribution wiring with the sealing resin. However, since the sealing resin is non-photosensitive, laser processing or the like is required to form the opening. Therefore, an apparatus for laser processing and an expensive manufacturing process are required. Further, there is a possibility that a residual film (smear) may be generated due to the laser processing, and a chemical solution and an etching process are required to remove the residual film. Namely, when a sealing resin such as an epoxy resin is applied to the technique disclosed in Patent Document 3, a problem that the manufacturing cost increases significantly arises.

A main object of this application is to provide a redistribution wiring structure that can allow a large current and to provide a technique capable of realizing a fine pitch between redistribution wirings for the redistribution wirings in which a large current is not required. In other words, a main object of this application is to improve the performance of the semiconductor device and to miniaturize the semiconductor device.

Other problems and novel features will become apparent from the description of this specification and the accompanying drawings.

Means for Solving the Problem

An outline of a typical embodiment disclosed in this application will be briefly described as follows.

A semiconductor device according to an embodiment includes: a semiconductor wafer having a first pad electrode and a plurality of second pad electrodes formed on an upper surface thereof; an insulating film covering the first pad electrode and the plurality of second pad electrodes; a first opening formed in the insulating film so as to reach an upper surface of the first pad electrode; a plurality of second openings formed in the insulating film so as to reach upper surfaces of the plurality of second pad electrodes; a first redistribution wiring formed in the first opening and on the insulating film and electrically connected to the first pad electrode; a first columnar electrode formed on the first redistribution wiring and having a thickness larger than that of the first redistribution wiring; a second columnar electrode formed on the first columnar electrode and having a thickness larger than that of the first redistribution wiring; a second redistribution wiring formed in the plurality of second openings and on the insulating film and electrically connected to the plurality of second pad electrodes; a third redistribution wiring formed on the second redistribution wiring and having a thickness larger than that of the second redistribution wiring; a plurality of third columnar electrodes formed on the third redistribution wiring and having a thickness larger than that of the second redistribution wiring; a sealing resin formed on the insulating film and configured to seal the first redistribution wiring, the first columnar electrode, the second columnar electrode, the second redistribution wiring, the third redistribution wiring, and the plurality of third columnar electrodes so as to expose upper surfaces of the second columnar electrode and the plurality of third columnar electrodes; and a plurality of external connection terminals formed on the upper surfaces of the second columnar electrode and the plurality of third columnar electrodes. Here, the first redistribution wiring has a wide region for providing the first columnar electrode and the second columnar electrode and a narrow region extending from the first opening to the wide region and connecting the first pad electrode and the wide region, and in plan view, a width of the narrow region is smaller than a width of the wide region.

A method of manufacturing a semiconductor device according to an embodiment includes steps of: (a) preparing a semiconductor wafer having a first pad electrode and a plurality of second pad electrodes formed on an upper surface thereof; (b) after the step (a), forming an insulating film covering the first pad electrode and the plurality of second pad electrodes; (c) after the step (b), forming, in the insulating film, a first opening reaching an upper surface of the first pad electrode and a plurality of second openings reaching upper surfaces of the plurality of second pad electrodes; (d) after the step (c), forming a first redistribution wiring electrically connected to the first pad electrode in the first opening and on the insulating film and forming a second redistribution wiring electrically connected to the plurality of second pad electrodes in the plurality of second openings and on the insulating film; (e) after the step (d), forming a first columnar electrode having a thickness larger than that of the first redistribution wiring on the first redistribution wiring and forming a third redistribution wiring having a thickness larger than that of the second redistribution wiring on the second redistribution wiring; (f) after the step (e), forming a second columnar electrode having a thickness larger than that of the first redistribution wiring on the first columnar electrode and forming a plurality of third columnar electrodes having a thickness larger than that of the second redistribution wiring on the third redistribution wiring; (g) after the step (f), sealing the first redistribution wiring, the first columnar electrode, the second columnar electrode, the second redistribution wiring, the third redistribution wiring, and the plurality of third columnar electrodes with a sealing resin on the insulating film so as to cover upper surfaces of the second columnar electrode and the plurality of third columnar electrodes; (h) after the step (g), polishing the sealing resin to expose the upper surfaces of the second columnar electrode and the plurality of third columnar electrodes; and (i) after the step (h), forming a plurality of external connection terminals on the upper surfaces of the second columnar electrode and the plurality of third columnar electrodes. Here, the first redistribution wiring has a wide region for providing the first columnar electrode and the second columnar electrode and a narrow region extending from the first opening to the wide region and connecting the first pad electrode and the wide region, and in plan view, a width of the narrow region is smaller than a width of the wide region.

Effects of the Invention

According to one embodiment, it is possible to improve the performance of the semiconductor device and to promote the miniaturization of the semiconductor device.

BRIEF DESCRIPTIONS OF THE DRAWINGS

DETAILED DESCRIPTION

Figure 1:
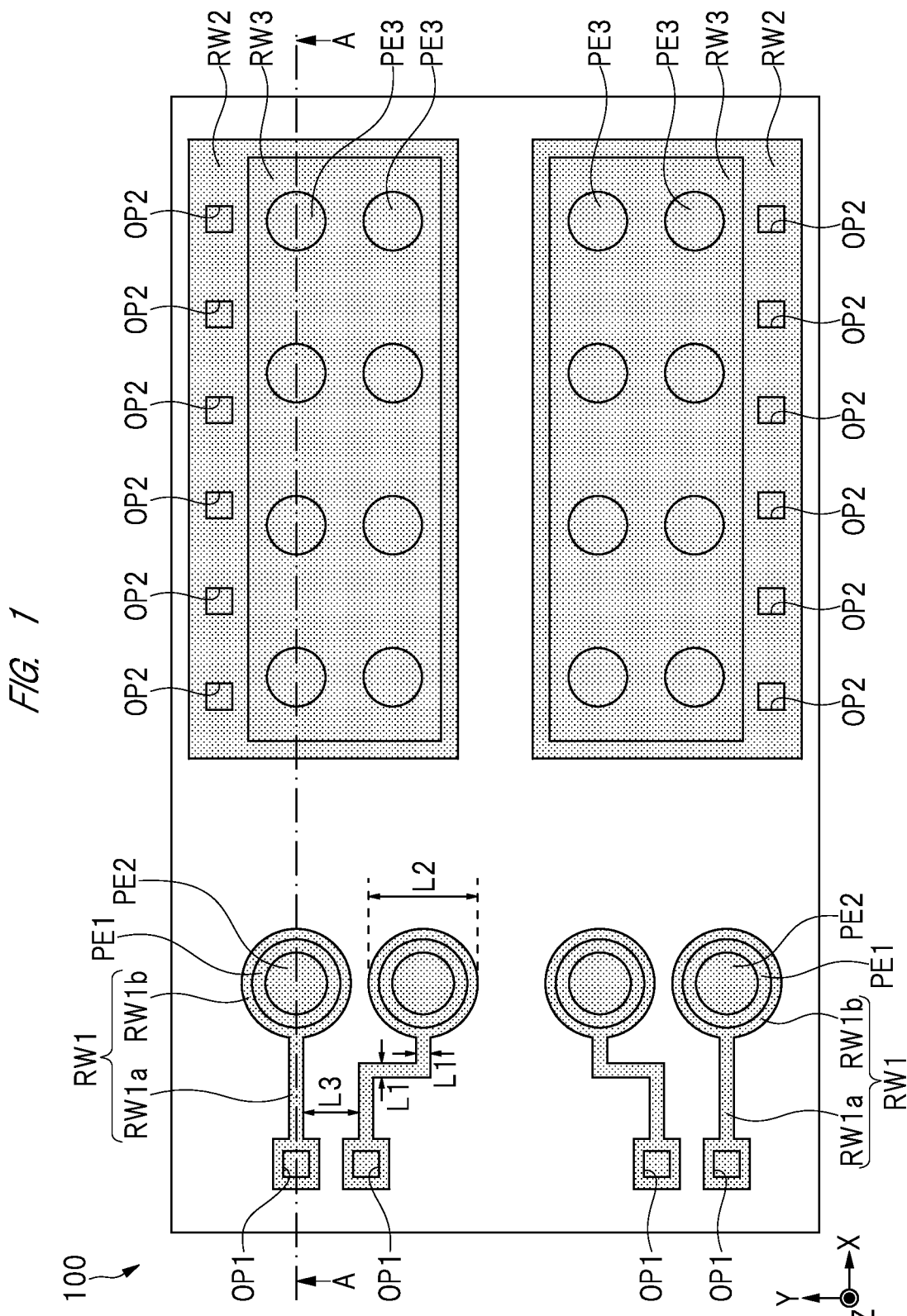
FIG. 1 is a plan view showing a semiconductor device according to the first embodiment.

Hereinafter, embodiments will be described in detail with reference to drawings. Note that the members having the same function are denoted by the same reference characters throughout the drawings for describing the embodiments, and the repetitive description thereof will be omitted. Further, in the following embodiments, the description of the same or similar part will not be repeated in principle unless particularly required.

Also, the X direction, the Y direction, and the Z direction in the description of this application cross each other and are orthogonal to each other. In the description of this application, the Z direction is defined as the longitudinal direction, the height direction, or the thickness direction of a certain structure. Further, the expression "in plan view" or the like used in this application means that a plane configured by the X direction and the Y direction is seen in the Z direction.

FIRST EMBODIMENT

Structure of Semiconductor Device

Figure 2:
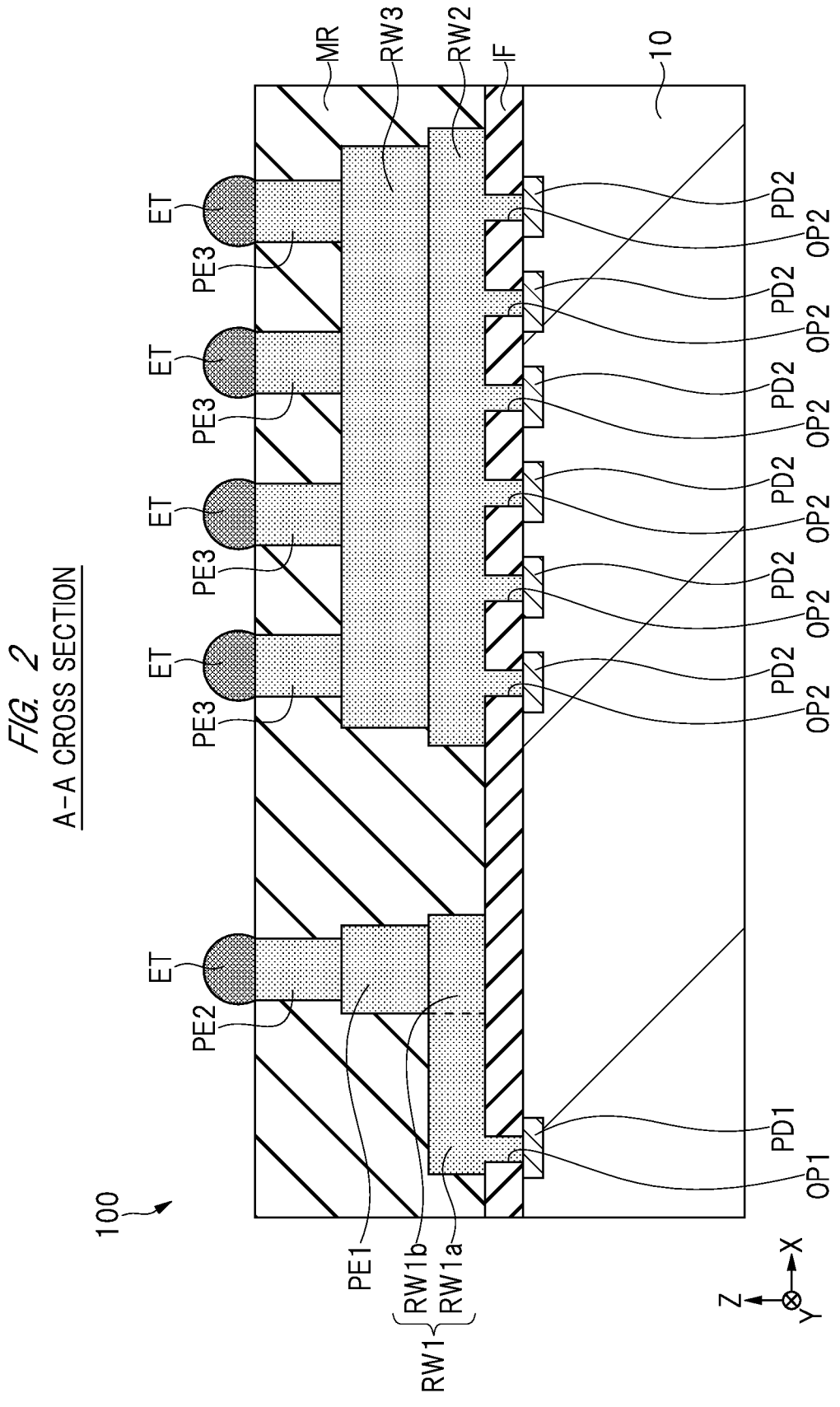
FIG. 2 is a cross-sectional view showing the semiconductor device according to the first embodiment.

A semiconductor device 100 according to the first embodiment will be described below with reference to FIG. 1 and FIG. 2. The semiconductor device 100 is a semiconductor chip provided with redistribution wirings RW1 to RW3 and columnar electrodes PE1 to PE3 on a semiconductor wafer 10. FIG. 1 is a plan view showing a part of the semiconductor device 100, and FIG. 2 is a cross-sectional view taken along the line A-A in FIG. 1. Note that openings OP2 and pad electrodes PD2 are originally not shown in the cross-sectional view taken along the line A-A, but they are intentionally shown in FIG. 2 in order to make the connection relationship of each configuration easily understood.

The semiconductor wafer 10 includes an integrated circuit made up of a plurality of transistors formed on a semiconductor substrate made of silicon or the like and a multi-layer wiring layer formed on the semiconductor substrate. Further, the semiconductor wafer 10 has a plurality of pad electrodes PD1 and a plurality of pad electrodes PD2 formed on an upper surface thereof. The plurality of pad electrodes PD1 and the plurality of pad electrodes PD2 are a part of the wiring formed in the uppermost layer of the multi-layer wiring layer. The plurality of pad electrodes PD1 and the plurality of pad electrodes PD2 include a conductive film mainly made of aluminum and have a thickness of, for example, 300 to 1000 nm.

As shown in FIG. 1 and FIG. 2, an insulating film IF covers the plurality of pad electrodes PD1 and the plurality of pad electrodes PD2. The insulating film IF is, for example, a photosensitive polyimide film, and has a thickness of, for example, 3 to 10 μm. A plurality of openings OP1 are formed in the insulating film IF so as to reach upper surfaces of the plurality of pad electrodes PD1. Further, a plurality of openings OP2 are formed in the insulating film IF so as to reach upper surfaces of the plurality of pad electrodes PD2. Note that a protective film such as a silicon nitride film may be formed between the insulating film IF and the upper surface of the semiconductor wafer 10 (pad electrode PD1, pad electrode PD2) in order to prevent moisture from entering the inside of the semiconductor wafer 10.

The redistribution wiring RW1 is formed in the opening OP1 and on the insulating film IF, and is electrically connected to the pad electrode PD1. Although the semiconductor device 100 is provided with a plurality of redistribution wirings RW1, one redistribution wiring RW1 is connected to one pad electrode PD1 here. The redistribution wiring RW2 is formed in the plurality of openings OP2 and on the insulating film IF, and is electrically connected to the plurality of pad electrodes PD2. Here, one redistribution wiring RW2 is connected to the plurality of pad electrodes PD2. The redistribution wiring RW1 and the redistribution wiring RW2 are formed in the same layer and have the same thickness, for example, 1 μm or more and 10 μm or less.

The columnar electrode PE1 having a thickness larger than that of the redistribution wiring RW1 is formed on the redistribution wiring RW1. The redistribution wiring RW3 having a thickness larger than that of the redistribution wiring RW2 is formed on the redistribution wiring RW2. The columnar electrode PE1 and the redistribution wiring RW3 are formed in the same layer and have the same thickness, for example, 10 μm or more and 50 μm or less.

The columnar electrode PE2 having a thickness larger than that of the redistribution wiring RW1 is formed on the columnar electrode PE1. The plurality of columnar electrodes PE3 having a thickness larger than that of the redistribution wiring RW2 are formed on the redistribution wiring RW3. The columnar electrode PE2 and the plurality of columnar electrodes PE3 are formed in the same layer and have the same thickness, for example, 30 μm or more and 50 μm or less.

Note that the redistribution wirings RW1 to RW3 and the columnar electrodes PE1 to PE3 are made of a material having a sheet resistance value lower than that of the material constituting the pad electrodes PD1 and PD2, for example, a material containing copper as a main component.

A sealing resin MR that seals the redistribution wirings RW1 to RW3 and the columnar electrodes PE1 to PE3 is formed on the insulating film IF so as to expose upper surfaces of the columnar electrode PE2 and the plurality of third columnar electrodes PE3. The sealing resin MR is, for example, a non-photosensitive epoxy resin. An upper surface of the sealing resin MR is subjected to polishing process. Therefore, the upper surfaces of the columnar electrode PE2, the plurality of columnar electrodes PE3, and the sealing resin MR are flattened and flush with each other.

A plurality of external connection terminals ET are formed on the upper surfaces of the columnar electrode PE2 and the plurality of third columnar electrodes PE3. The external connection terminal ET is provided for electrical connection to a semiconductor chip or wiring board different from the semiconductor device 100, and is made of a conductive material such as a solder ball.

In plan view, the columnar electrode PE1 and the columnar electrode PE2 are located in a region different from the opening OP1, and the plurality of columnar electrodes PE3 are located in a region different from the plurality of openings OP2. By laying out the redistribution wiring RW1 and the redistribution wiring PW2, the external connection terminal ET can be provided at a position different from the pad electrode PD1 and the pad electrode PD2.

Further, the plurality of columnar electrodes PE3, the redistribution wiring RW3, the redistribution wiring RW2, and the plurality of pad electrodes PD2 are provided for power supply voltage or ground voltage, and a large current of, for example, 1 A or more and 10 A or less flows therethrough. Therefore, the size of the redistribution wiring RW3 and the redistribution wiring RW2 is large enough to be able to collectively connect the plurality of pad electrodes PD2. Also, the thickness of the redistribution wiring RW3 is made larger than the thickness of the redistribution wiring RW2. Therefore, even when a large current as described above is made to flow through the redistribution wiring RW3 and the redistribution wiring RW2, it is possible to prevent the occurrence of problems that have occurred in the conventional technique such as heat generation exceeding the allowable temperature, acceleration of electromigration, and disconnection due to fusing.

On the other hand, the columnar electrode PE1, the columnar electrode PE2, the redistribution wiring RW1, and the pad electrode PD1 are used for purposes other than power supply voltage or ground voltage, and are used for, for example, the transmission of digital signals or analog signals. In these purposes, there is no need to take measures against the large current as described above, but in order to efficiently lay out a large number of redistribution wirings RW1, the redistribution wirings RW1 are preferably arranged with a pitch as fine as possible in the redistribution wiring layer.

However, when attempting to simply form the redistribution wiring RW1 and the redistribution wiring RW2 to be thick, it becomes difficult to process the resist film used during manufacturing to a fine pitch, and it is thus necessary to increase the pitch. Consequently, the layout of the redistribution wiring RW1 is restricted and it becomes difficult to miniaturize the semiconductor device 100.

Moreover, when attempting to form a conductive layer in the same layer as the redistribution wiring RW3 (conductive layer in second layer) on the redistribution wiring RW1 based on the idea of stacking redistribution wirings as in the first embodiment, the conductive layer in the second layer also needs to be formed with a fine pitch. Therefore, there are restrictions on the material of the resist film and the exposure technique for forming the conductive layer in the second layer.

In consideration of the above, the redistribution wiring RW1 in the first embodiment has a narrow region RW1a and a wide region RW1b. In plan view, a width L1 of the narrow region RW1a is smaller than a width L2 of the wide region RW1b. The wide region RW1b is a region for providing the columnar electrode PE1 and the columnar electrode PE2. The narrow region RW1a extends from the opening OP1 to the wide region RW1b, and connects the pad electrode PD1 and the wide region RW1b.

The efficient layout can be realized by providing the wide region RW1b for only the region connected to the external connection terminal ET and arranging the narrow region RW1a with a fine pitch. Note that the width L1 of the narrow region RW1a in plan view is 5 μm or more and 50 μm or less. In addition, when two redistribution wirings RW1 are arranged adjacent to each other, the narrow region RW1a of one redistribution wiring RW1 and the narrow region RW1a of the other redistribution wiring RW1 are adjacent to each other within a range of 5 μm or more and 50 μm or less. Namely, a distance L3 in FIG. 1 is 5 μm or more and 50 μm or less.

Note that, although the redistribution wiring RW1 is located at a position away from the redistribution wiring RW2 in FIG. 1, the arrangement of the redistribution wiring RW1 is not limited to this. For example, there may be a case where the narrow region RW1a of the redistribution wiring RW1 extends adjacent to the redistribution wiring RW2. In any case, the narrow region RW1a and other redistribution wirings are arranged while ensuring the distance equal to or larger than the distance L3 therebetween.

A width of each of the columnar electrode PE2 and the columnar electrode PE3 in plan view is 80 μm or more and 300 μm or less. Further, in plan view, the outer periphery of the columnar electrode PE1 includes the outer periphery of the columnar electrode PE2, and the distance between the outer periphery of the columnar electrode PE1 and the outer periphery of the columnar electrode PE2 is 5 μm to 10 μm. Further, in plan view, the outer periphery of the wide region RW1b includes the outer periphery of the columnar electrode PE1, and the distance between the outer periphery of the wide region RW1b and the outer periphery of the columnar electrode PE1 is 5 μm to 10 μm. Therefore, the width L2 of the wide region RW1b is 100 μm or more and 500 μm or less.

Note that the width of each of the wide region RW1b and the columnar electrodes PE1 to PE3 is the width in the direction perpendicular to the extending direction of the narrow region RW1a at the location where the narrow region RW1a is connected to the wide region RW1b. Further, the wide region RW1b and the columnar electrodes PE1 to PE3 have a cylindrical shape here, and the width of each of the wide region RW1b and the columnar electrodes PE1 to PE3 in this case indicates the diameter thereof. In other words, the wide region RW1*b* and the columnar electrodes PE1 to PE3 do not necessarily have the cylindrical shape, and may have any shapes such as a polygonal shape including a quadrangular shape.

As described above, it is possible to secure the region for flowing a large current by using the plurality of columnar electrodes PE3, the redistribution wiring RW3, and the redistribution wiring RW2, and it is also possible to arrange the redistribution wirings RW1 (narrow regions RW1*a*) with a fine pitch. Therefore, it is possible to improve the performance of the semiconductor device 100, and promote the miniaturization of the semiconductor device 100.

Note that, in plan view, the outer periphery of the redistribution wiring RW2 includes the outer periphery of the redistribution wiring RW3, and the distance between the outer periphery of the redistribution wiring RW2 and the outer periphery of the redistribution wiring RW3 is 5 μm to 10 μm. Further, in plan view, the outer periphery of the redistribution wiring RW3 includes the outer peripheries of the plurality of columnar electrodes PE3. Namely, the outer periphery of the redistribution wiring layer (wide region RW1*b*, redistribution wiring RW2) in the first layer includes the outer periphery of the redistribution wiring layer (columnar electrode PE1, redistribution wiring RW3) in the second layer, and the outer periphery of the redistribution wiring layer in the second layer includes the outer periphery of the redistribution wiring layer (columnar electrode PE2, columnar electrode PE3) in the third layer. For this reason, there are no portions overhanging in the upper layer with respect to the lower layer. Therefore, it is possible to improve the filling properties of the sealing resin MR when forming the sealing resin MR.

Method of Manufacturing Semiconductor Device

Figure 3:
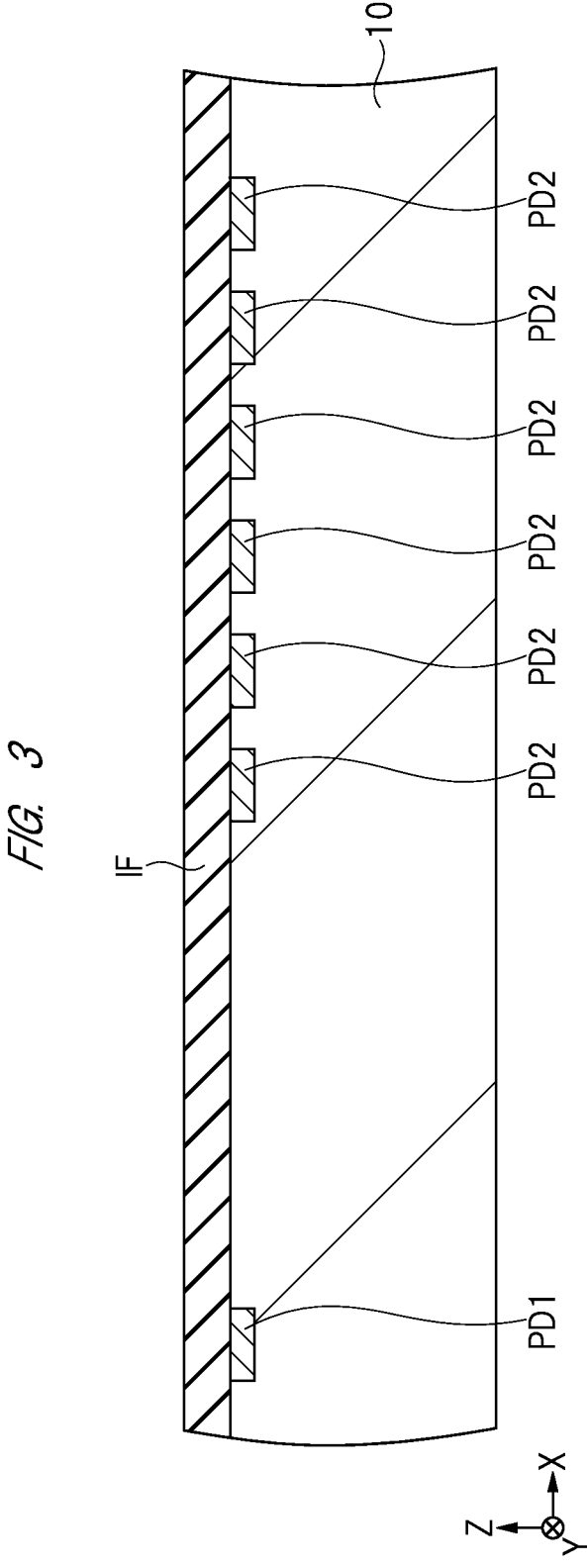
FIG. 3 is a cross-sectional view showing a manufacturing process of the semiconductor device according to the first embodiment.

A method of manufacturing the semiconductor device according to the first embodiment will be described below with reference to FIG. 3 to FIG. 17. First, as shown in FIG. 3, the semiconductor wafer 10 provided with the pad electrode PD1 and the plurality of pad electrodes PD2 on the upper surface thereof is prepared. Next, the insulating film IF covering the pad electrode PD1 and the plurality of pad electrodes PD2 is formed. The insulating film IF is, for example, a photosensitive polyimide film and can be formed by, for example, the coating method.

Figure 4:
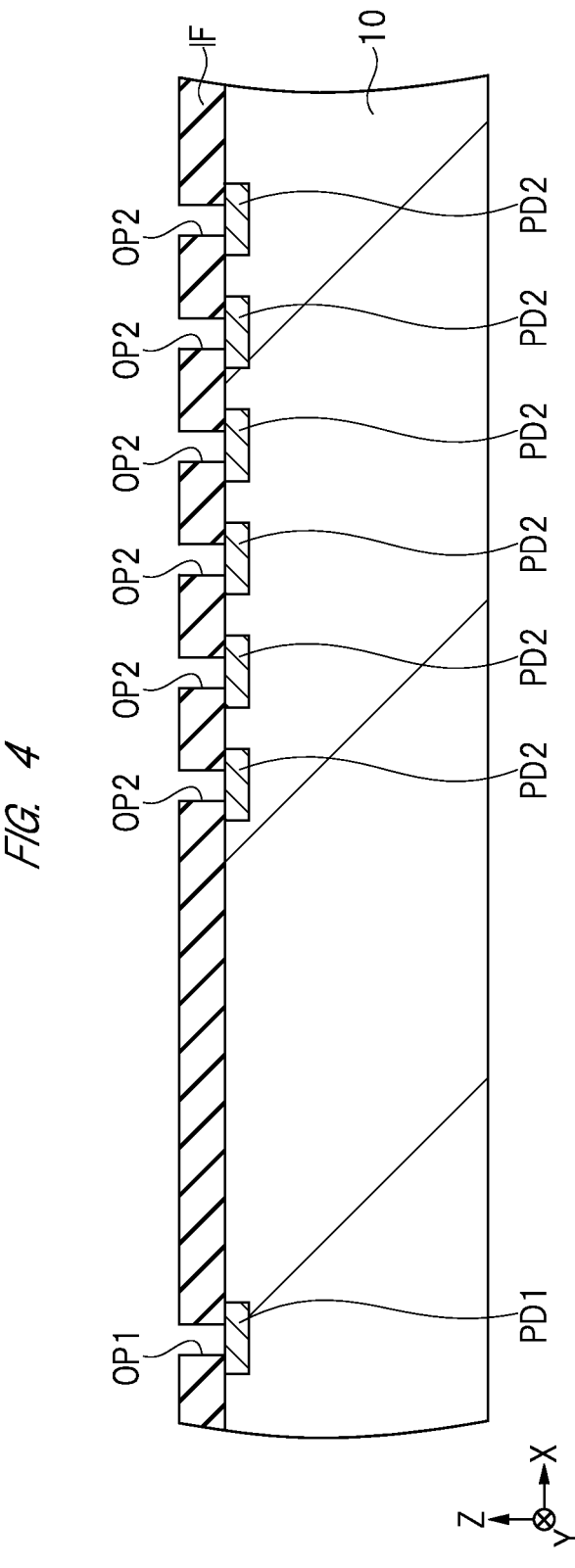
FIG. 4 is a cross-sectional view showing the manufacturing process of the semiconductor device subsequent to FIG. 3.

Next, as shown in FIG. 4, the insulating film IF is patterned by selectively performing exposure process to the insulating film IF. As a result, the opening OP1 reaching the upper surface of the pad electrode PD1 and the plurality of openings OP2 reaching the upper surfaces of the plurality of pad electrodes PD2 are formed in the insulating film IF. Thereafter, the insulating film IF is hardened by performing heat treatment to the insulating film IF.

Figure 5:
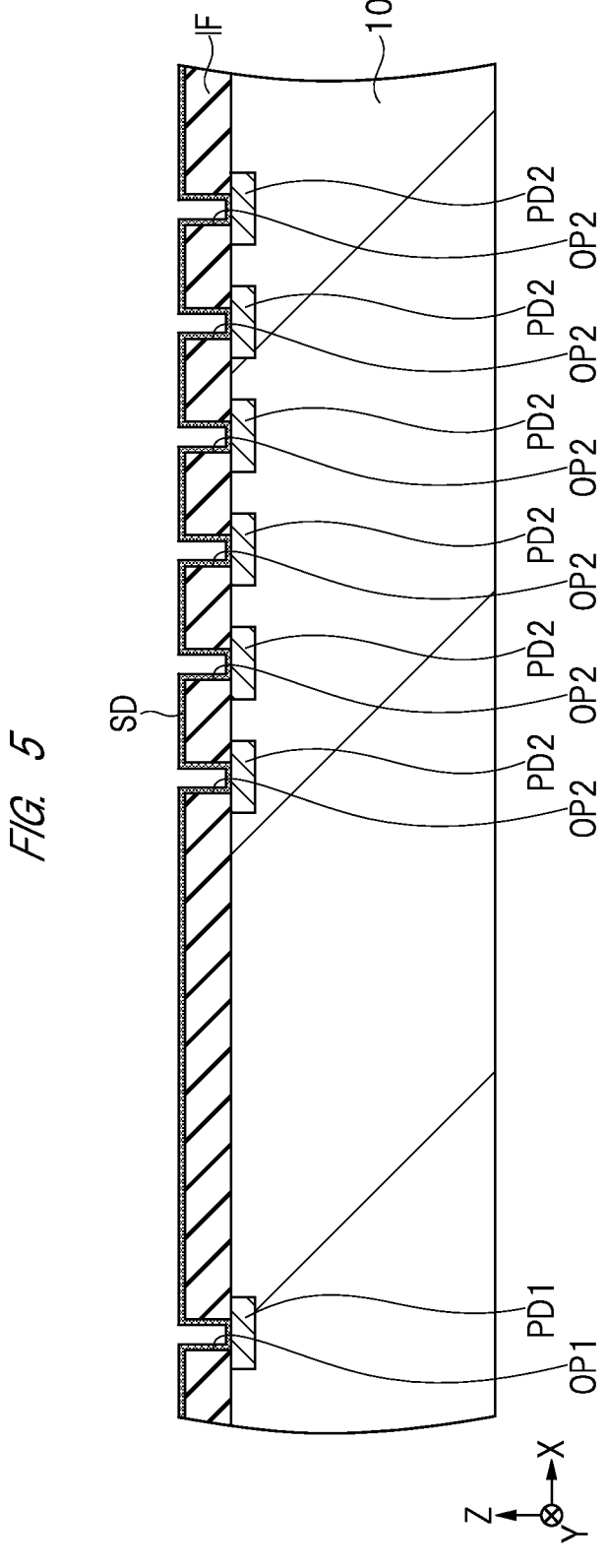
FIG. 5 is a cross-sectional view showing the manufacturing process of the semiconductor device subsequent to FIG. 4.

Next, as shown in FIG. 5, a seed layer SD is formed in the opening OP1, in the plurality of openings OP2, and on the insulating film IF by the sputtering method. The seed layer SD is composed of, for example, a barrier metal film such as a titanium film and a copper film. Note that the film thickness of the seed layer SD is about 200 to 800 nm.

Figure 6:
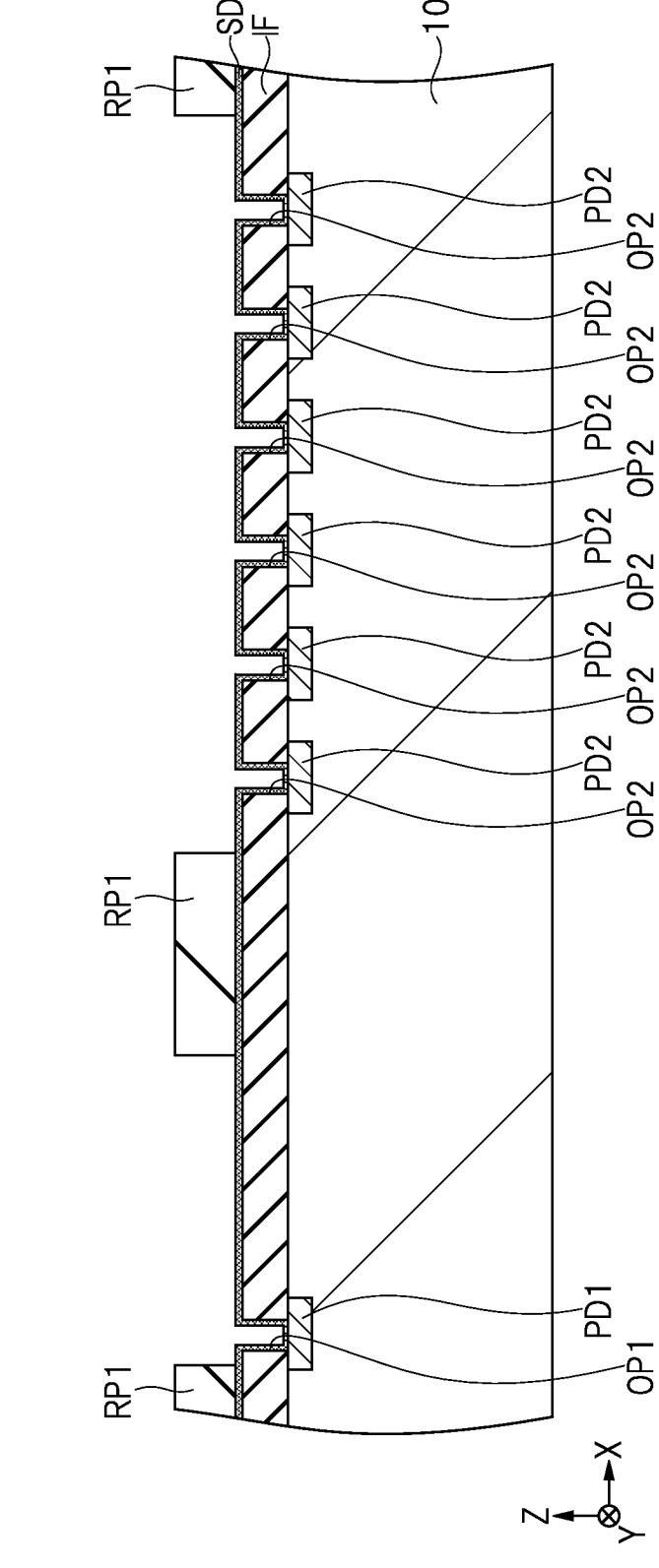
FIG. 6 is a cross-sectional view showing the manufacturing process of the semiconductor device subsequent to FIG. 5.

Next, as shown in FIG. 6, a resist pattern RP1 having a pattern that opens at least the opening OP1 and the plurality of openings OP2 is formed on the insulating film IF. The resist pattern RP1 is formed by forming a first resist film by the coating method and patterning the first resist film by selectively performing exposure process to the first resist film.

Figure 7:
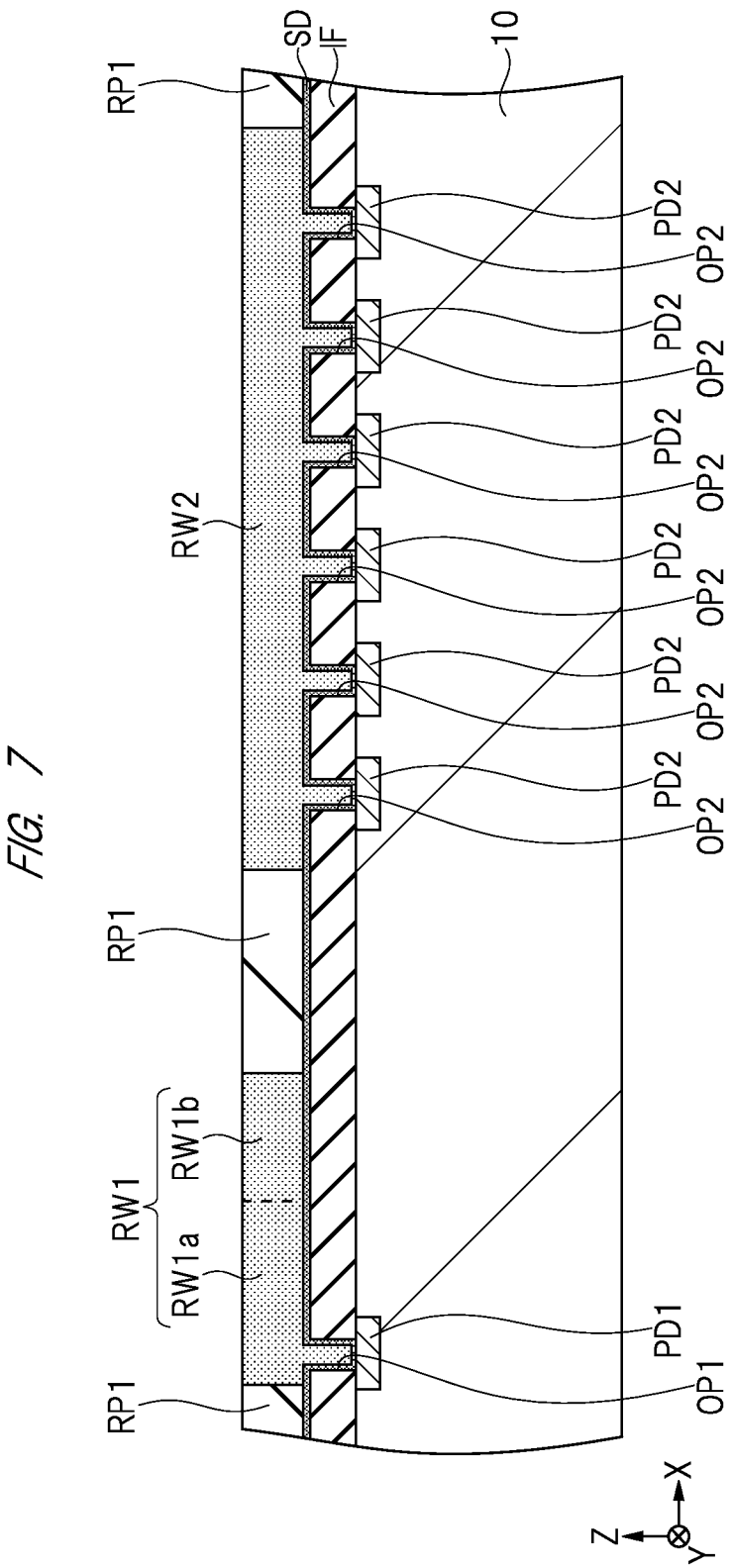
FIG. 7 is a cross-sectional view showing the manufacturing process of the semiconductor device subsequent to FIG. 6.

Next, as shown in FIG. 7, the redistribution wiring RW1 electrically connected to the pad electrode PD1 is formed in the opening OP1 and on the insulating film IF, and the redistribution wiring RW2 electrically connected to the plurality of pad electrodes PD2 is formed in the plurality of openings OP2 and on the insulating film IF. Specifically, by the electroplating method, the redistribution wiring RW1 is formed in the opening OP1 and on the insulating film IF exposed from the resist pattern RP1 via the seed layer SD, and the redistribution wiring RW2 is formed in the plurality of openings OP2 and on the insulating film IF exposed from the resist pattern RP1 via the seed layer SD.

In the following description, the seed layer SD covered with the redistribution wiring RW1 and the redistribution wiring RW2 will be described as a part of the redistribution wiring RW1 and the redistribution wiring RW2, and illustration thereof will be omitted.

Figure 8:
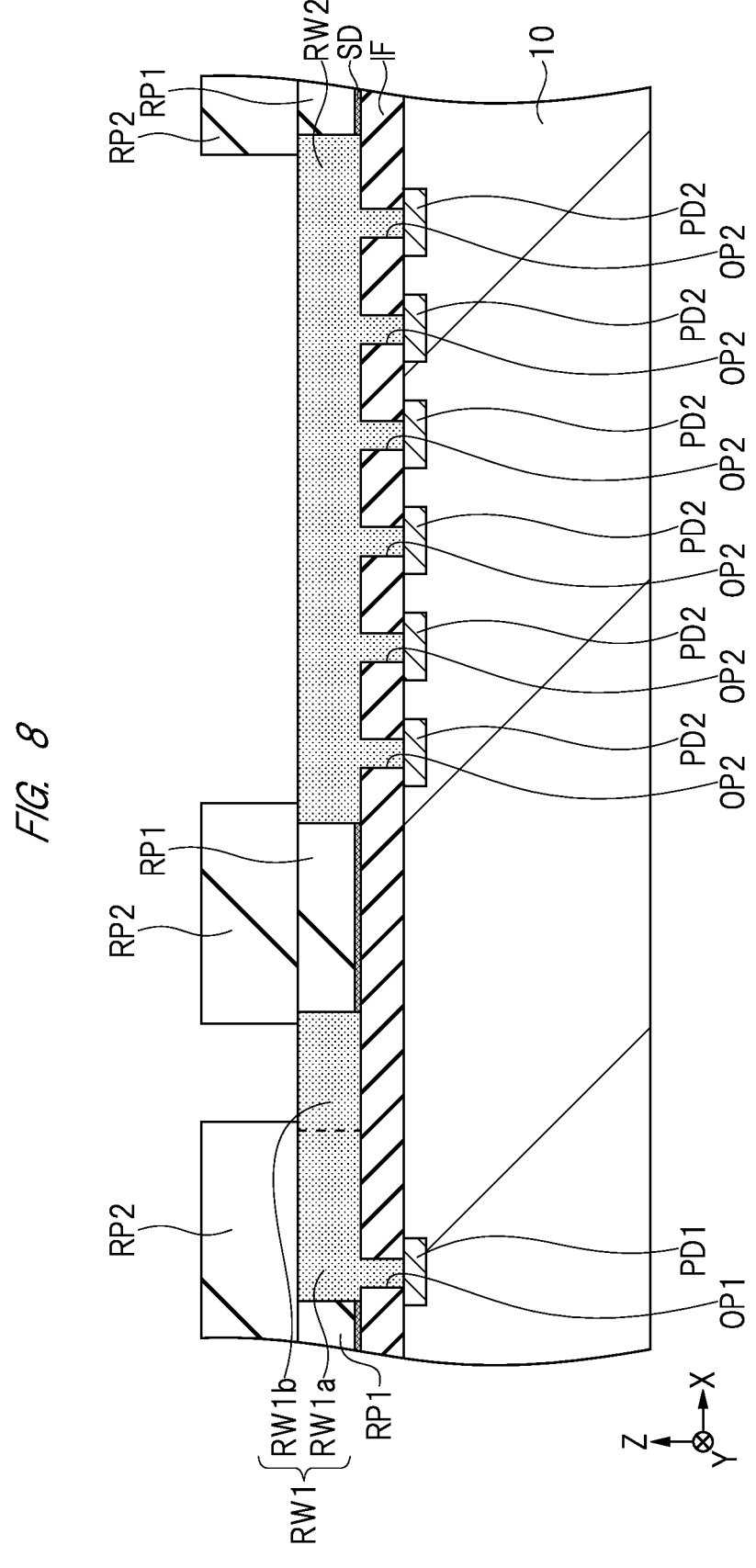
FIG. 8 is a cross-sectional view showing the manufacturing process of the semiconductor device subsequent to FIG. 7.

Next, as shown in FIG. 8, a resist pattern RP2 having a pattern that opens at least a part of each of the redistribution wiring RW1 and the redistribution wiring RW2 is formed on the upper surfaces of the resist pattern RP1, the redistribution wiring RW1, and the redistribution wiring RW2. The resist pattern RP2 is formed by forming a first resist film by the coating method and patterning the first resist film by selectively performing exposure process to the first resist film. Note that the first resist film mentioned here is made of the same material as that used for forming the resist pattern RP1.

Figure 9:
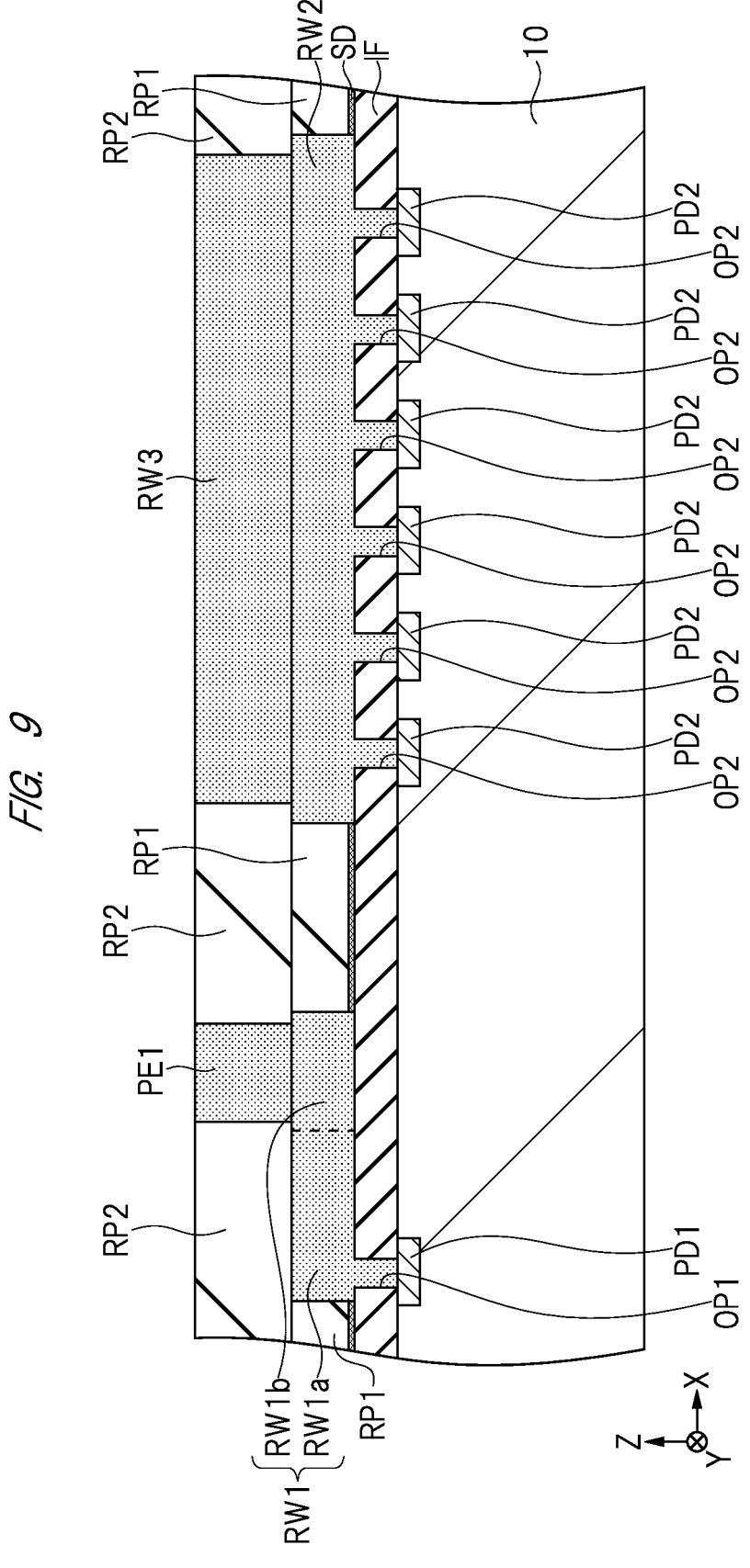
FIG. 9 is a cross-sectional view showing the manufacturing process of the semiconductor device subsequent to FIG. 8.

Next, as shown in FIG. 9, the columnar electrode PE1 having a thickness larger than that of the redistribution wiring RW1 is formed on the redistribution wiring RW1, and the redistribution wiring RW3 having a thickness larger than that of the redistribution wiring RW2 is formed on the redistribution wiring RW2. Specifically, by the electrolytic plating method, the columnar electrode PE1 is formed on the redistribution wiring RW1 exposed from the resist pattern RP2, and the redistribution wiring RW3 is formed on the redistribution wiring RW2 exposed from the resist pattern RP2.

Figure 10:
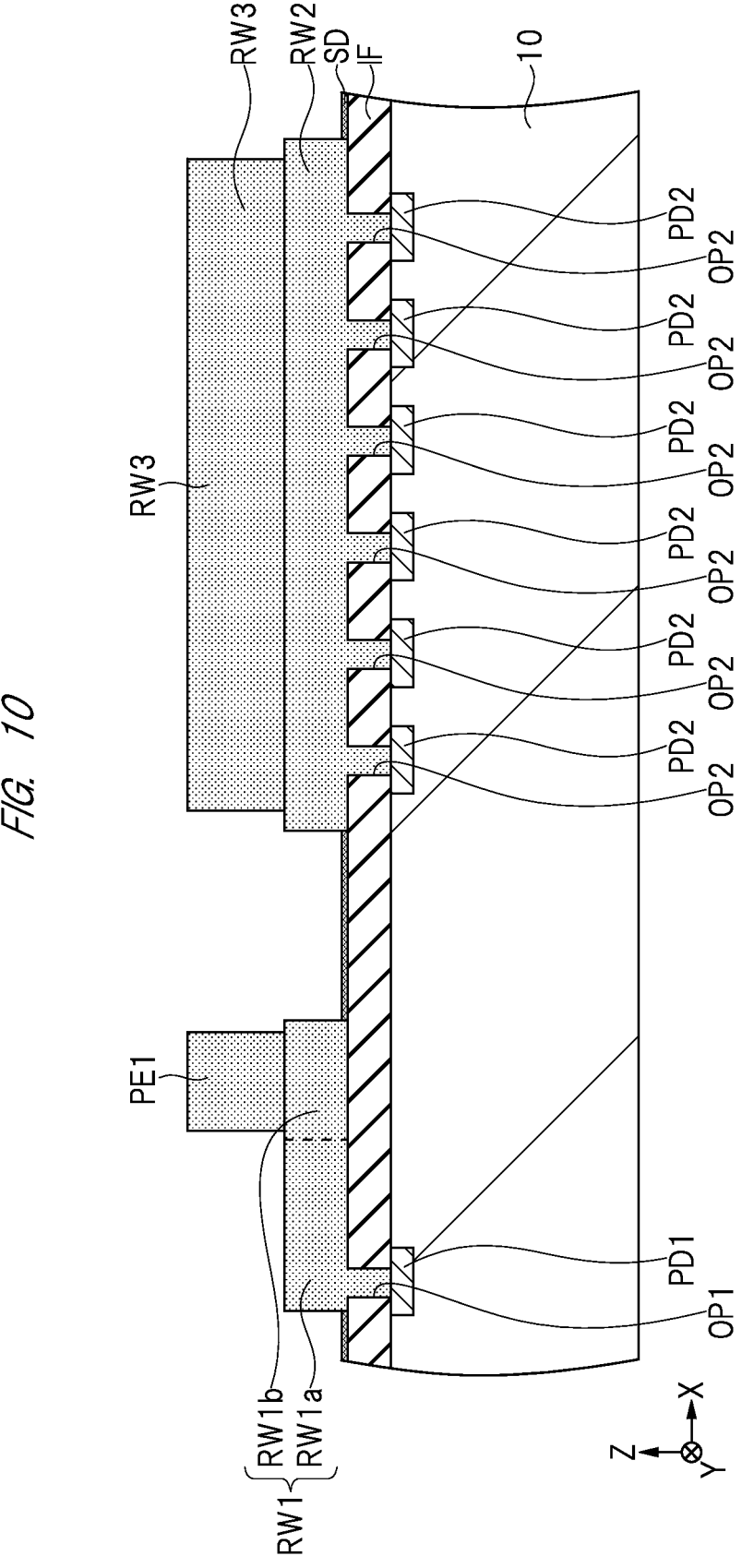
FIG. 10 is a cross-sectional view showing the manufacturing process of the semiconductor device subsequent to FIG. 9.

Next, as shown in FIG. 10, the resist pattern RP2 and the resist pattern RP1 are sequentially removed by, for example, dissolution using a stripping solution. By removing the resist pattern RP2 and the resist pattern RP1 in the same process, the manufacturing process can be simplified.

Note that the resist pattern RP2 and the resist pattern RP1 may be removed by separate processes. Namely, the resist pattern RP1 may be removed after removing the resist pattern RP2. Depending on the pitch of the redistribution wiring or the thickness of the redistribution wiring, residues of the resist pattern RP2 or the resist pattern RP1 may be generated, but the residues can be further reduced by using the method of separately removing the resist patterns RP1 and RP2.

Moreover, when using the method of separately removing the resist patterns RP1 and RP2, the resist film to be the resist pattern RP2 may be a second resist film made of a different material from the first resist film. The second resist film is made of, for example, a dry film material, and can be formed by the lamination method.

Figure 11:
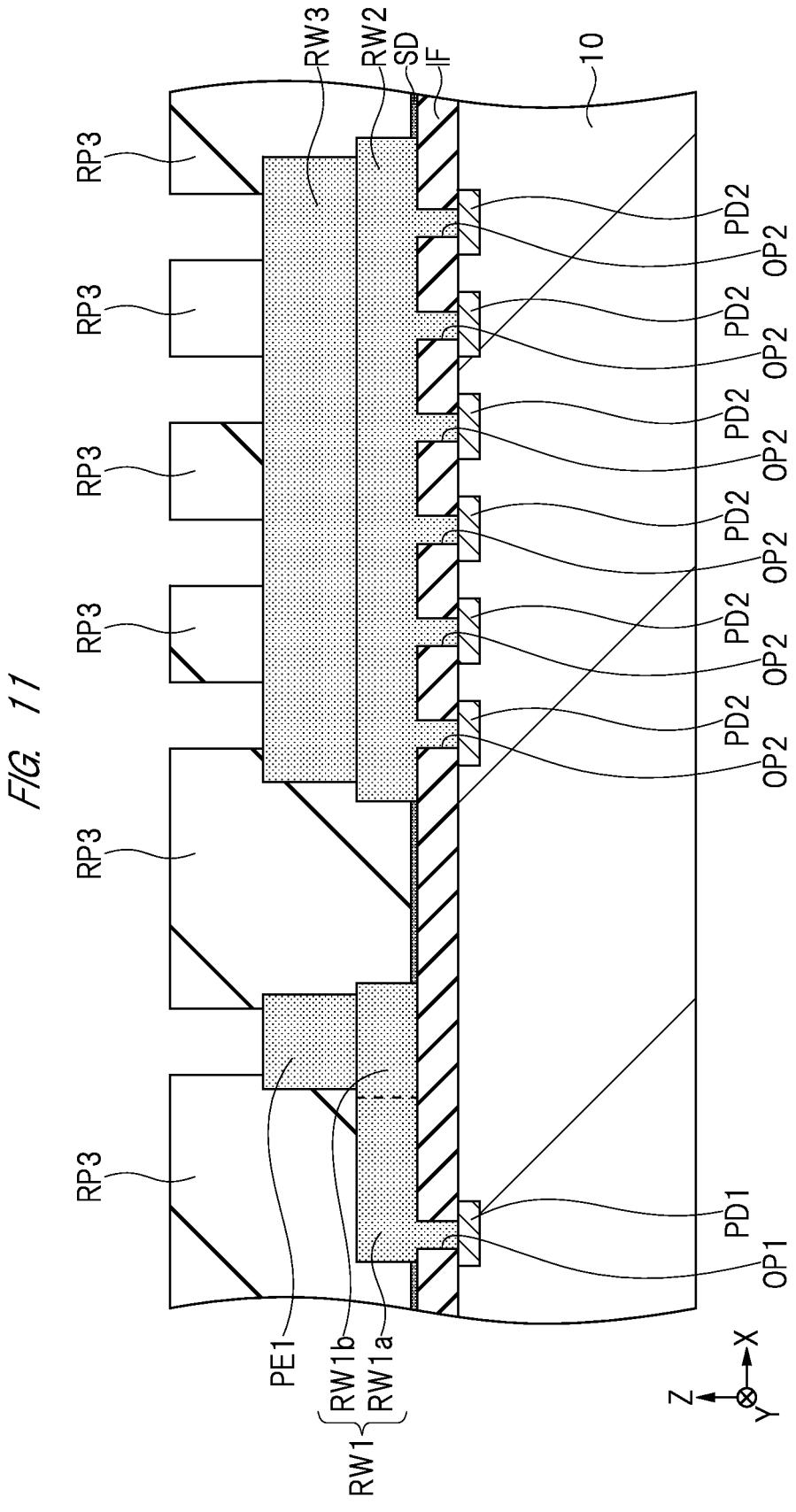
FIG. 11 is a cross-sectional view showing the manufacturing process of the semiconductor device subsequent to FIG. 10.

Next, as shown in FIG. 11, a resist pattern RP3 having a pattern that opens at least a part of each of the columnar electrode PE1 and the redistribution wiring RW3 is formed on the upper surfaces of the insulating film IF, the columnar electrode PE1, and the redistribution wiring RW3. The resist pattern RP3 is formed by forming the second resist film by the lamination method and patterning the second resist film by selectively performing exposure process to the second resist film.

Figure 12:
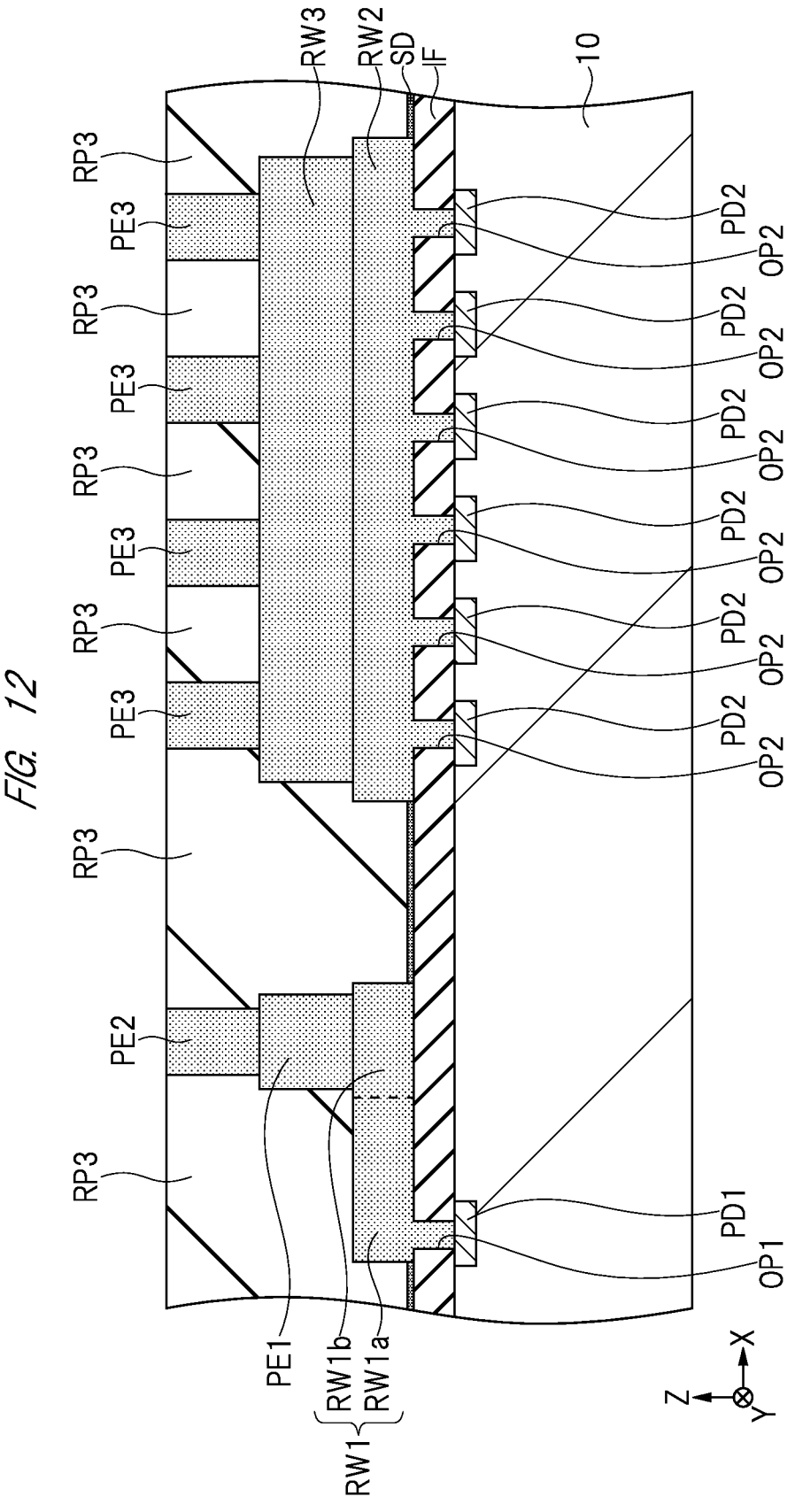
FIG. 12 is a cross-sectional view showing the manufacturing process of the semiconductor device subsequent to FIG. 11.

Next, as shown in FIG. 12, the columnar electrode PE2 having a thickness larger than that of the redistribution wiring RW1 is formed on the columnar electrode PE1, and the plurality of columnar electrodes PE3 having a thickness larger than that of the redistribution wiring RW2 are formed on the redistribution wiring RW3. Specifically, by the electrolytic plating method, the columnar electrode PE2 is formed on the columnar electrode PE1 exposed from the resist pattern RP3, and the plurality of columnar electrodes PE3 are formed on the redistribution wiring RW3 exposed from the resist pattern RP3.

Figure 13:
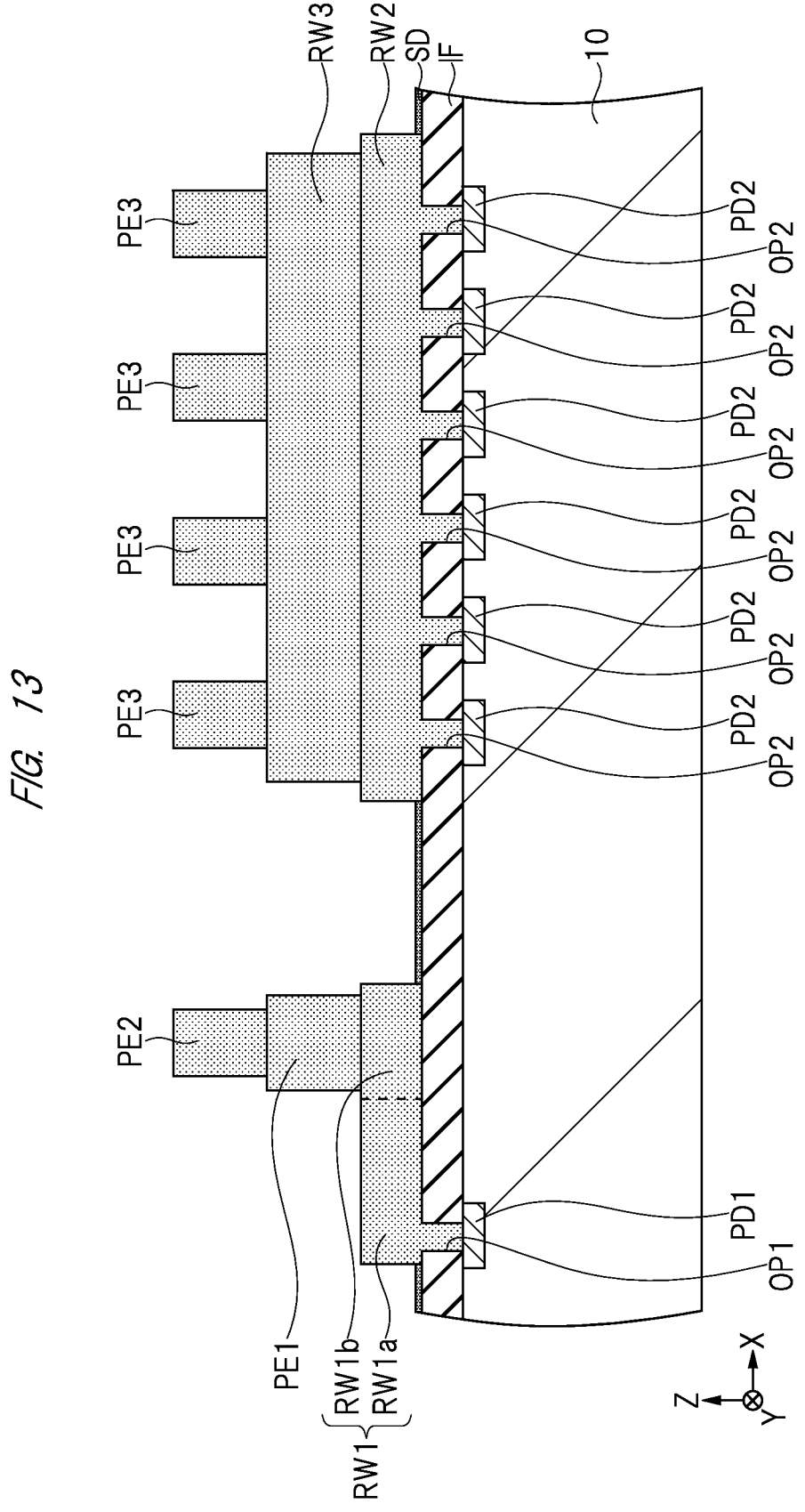
FIG. 13 is a cross-sectional view showing the manufacturing process of the semiconductor device subsequent to FIG. 12.

Next, as shown in FIG. 13, the resist pattern RP3 is removed by, for example, dissolution using a stripping solution.

Figure 14:
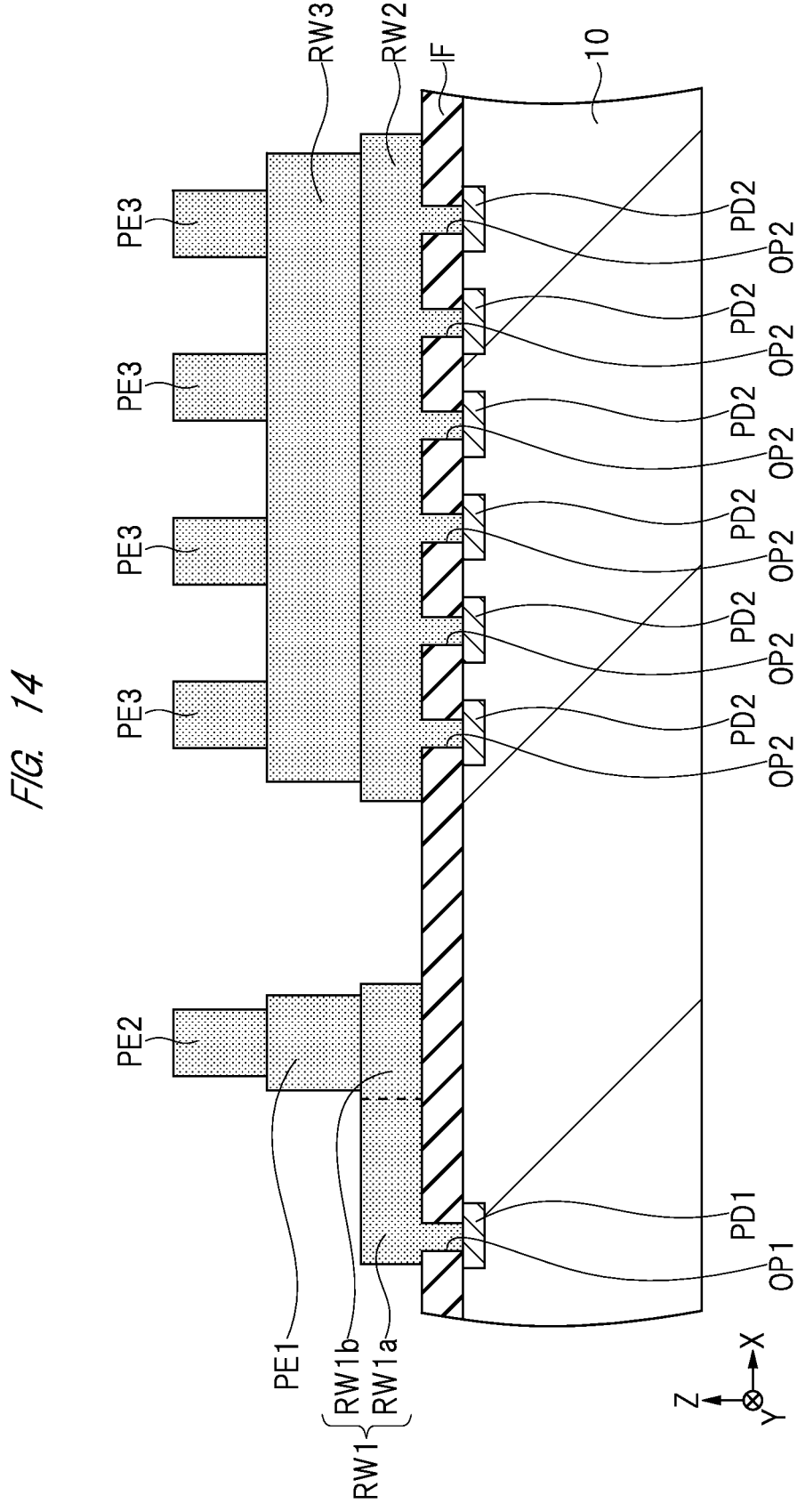
FIG. 14 is a cross-sectional view showing the manufacturing process of the semiconductor device subsequent to FIG. 13.

Next, as shown in FIG. 14, a wet etching process is performed to the seed layer SD remaining on the insulating film IF. As a result, the seed layer SD exposed from the redistribution wiring RW1 and the redistribution wiring RW2 is removed.

Figure 15:
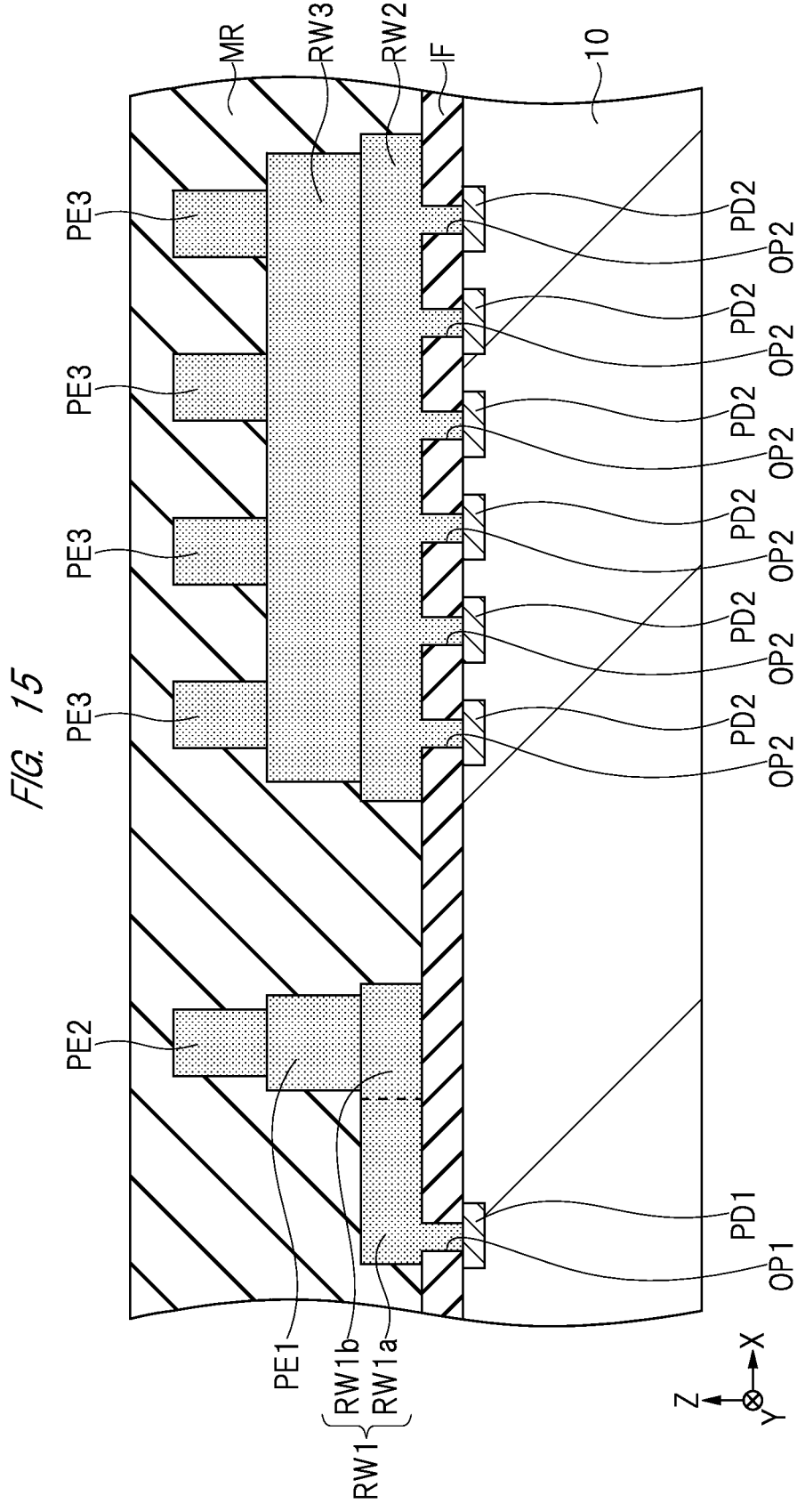
FIG. 15 is a cross-sectional view showing the manufacturing process of the semiconductor device subsequent to FIG. 14.

Next, as shown in FIG. 15, the redistribution wiring RW1, the columnar electrode PE1, the columnar electrode PE2, the redistribution wiring RW2, the redistribution wiring RW3, and the plurality of columnar electrodes PE3 are sealed with the sealing resin MR on the insulating film IF so as to cover the upper surfaces of the columnar electrode PE2 and the plurality of columnar electrodes PE3. The sealing resin MR is formed by, for example, the screen printing method. Furthermore, the sealing resin MR is formed up to a position about 50 to 100 μm from the upper surfaces of the columnar electrode PE2 and the plurality of columnar electrodes PE3.

Figure 16:
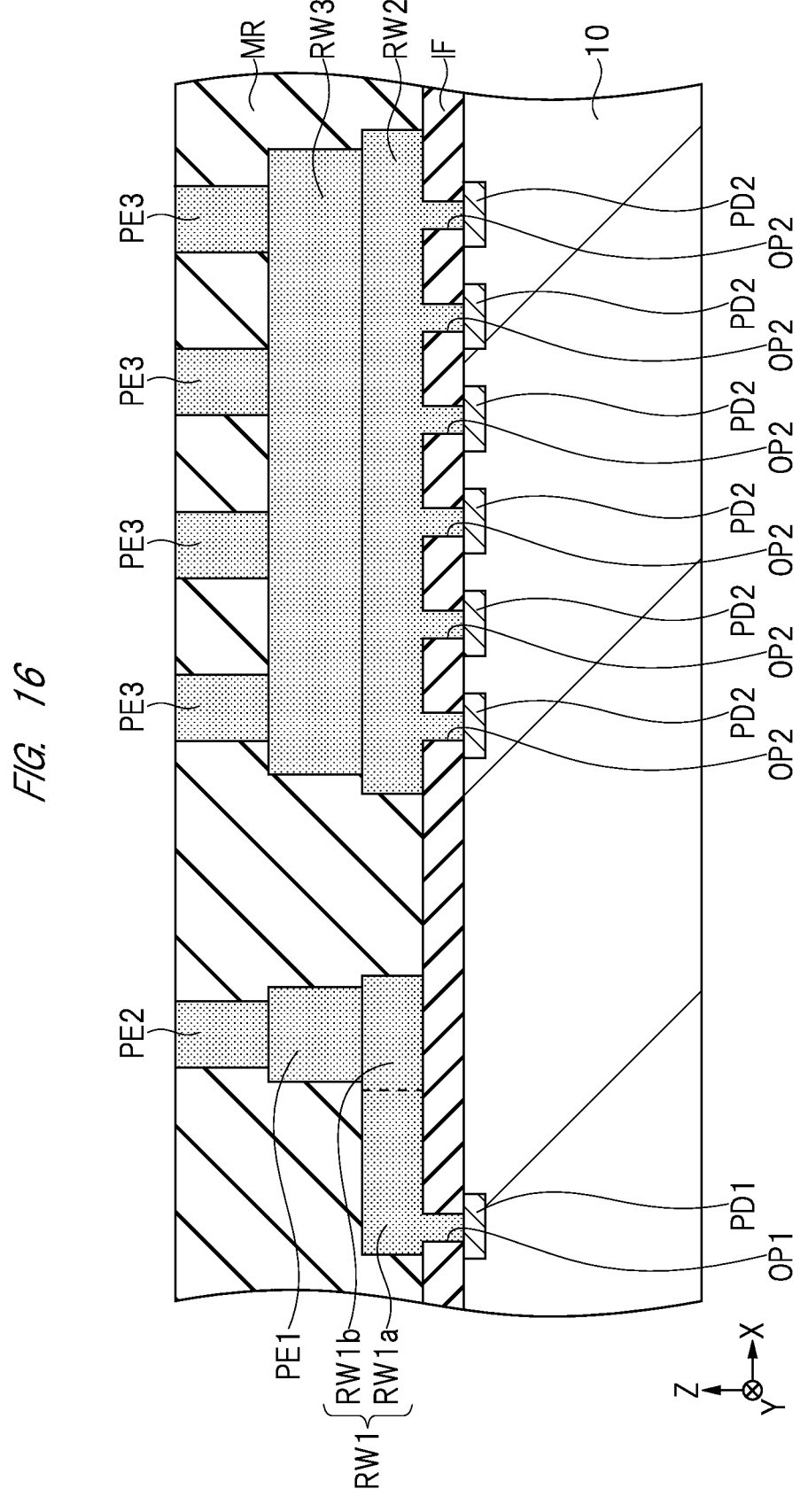
FIG. 16 is a cross-sectional view showing the manufacturing process of the semiconductor device subsequent to FIG. 15.

Next, as shown in FIG. 16, the sealing resin MR is polished to expose the upper surfaces of the columnar electrode PE2 and the plurality of columnar electrodes PE3 from the sealing resin MR. As a result, the upper surfaces of the columnar electrode PE2, the plurality of columnar electrodes PE3, and the sealing resin MR are flattened and flush with each other.

Note that the thickness of each of the columnar electrode PE2 and the plurality of columnar electrodes PE3 becomes, for example, 30 μm or more and 50 μm or less after this polishing process. Here, in the polishing process, not only the sealing resin MR but also the columnar electrode PE2 and the plurality of columnar electrodes PE3 are polished in some cases. On the assumption of such a case, the thickness of each of the columnar electrode PE2 and the plurality of columnar electrodes PE3 may be set to, for example, 50 μm or more and 90 μm or less in FIG. 12 by adjusting the thickness of the resist pattern RP3 in FIG. 11.

In the prior art, it was difficult to cover the thick redistribution wirings with photosensitive polyimide. However, in the first embodiment, since the sealing resin MR is formed by the screen printing method, even when the redistribution wirings RW1 to RW3 and the columnar electrodes PE1 to PE3 are thick, they can be completely covered.

Further, in the prior art, in order to ensure connection with the columnar electrode, it was necessary to form an opening in the sealing resin, and the laser processing or the like was required to form the opening. Therefore, there was a problem that the manufacturing cost increased significantly. In the first embodiment, since the upper surfaces of the columnar electrode PE2 and the plurality of columnar electrodes PE3 are exposed by polishing the sealing resin MR in the polishing process, the external connection terminals ET can be easily connected to the upper surfaces thereof, and it is possible to suppress the increase in manufacturing cost.

Figure 17:
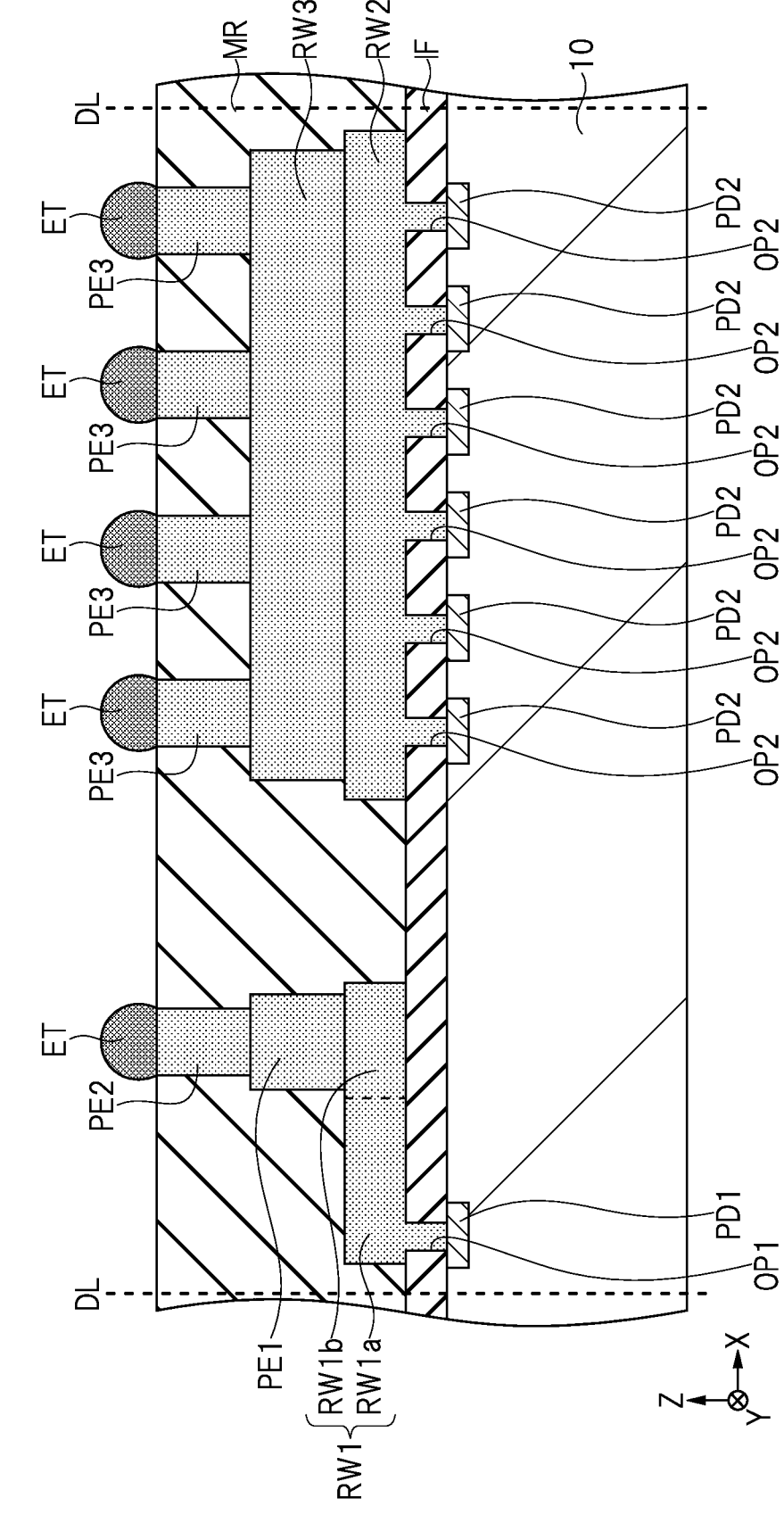
FIG. 17 is a cross-sectional view showing the manufacturing process of the semiconductor device subsequent to FIG. 16.

Next, as shown in FIG. 17, the plurality of external connection terminals ET are formed on the upper surfaces of the columnar electrode PE2 and the plurality of columnar electrodes PE3. The external connection terminal ET is made of a conductive material such as a solder ball, and can be formed by, for example, printing a solder paste and then performing the reflow process. Thereafter, by performing dicing along dicing lines DL, the semiconductor wafer 10 is divided into pieces, and the plurality of semiconductor devices 100 shown in FIG. 2 are obtained.

Through the above process, the semiconductor device 100 according to the first embodiment is manufactured.

SECOND EMBODIMENT

A method of manufacturing the semiconductor device 100 according to the second embodiment will be described below with reference to FIG. 18 to FIG. 20. Note that the differences from the first embodiment will be mainly described below, and descriptions of the points that overlap with the first embodiment will be omitted.

The manufacturing method according to the second embodiment is the same as that of the first embodiment up to FIG. 9. FIG. 18 shows the manufacturing process subsequent to FIG. 9.

Figure 18:
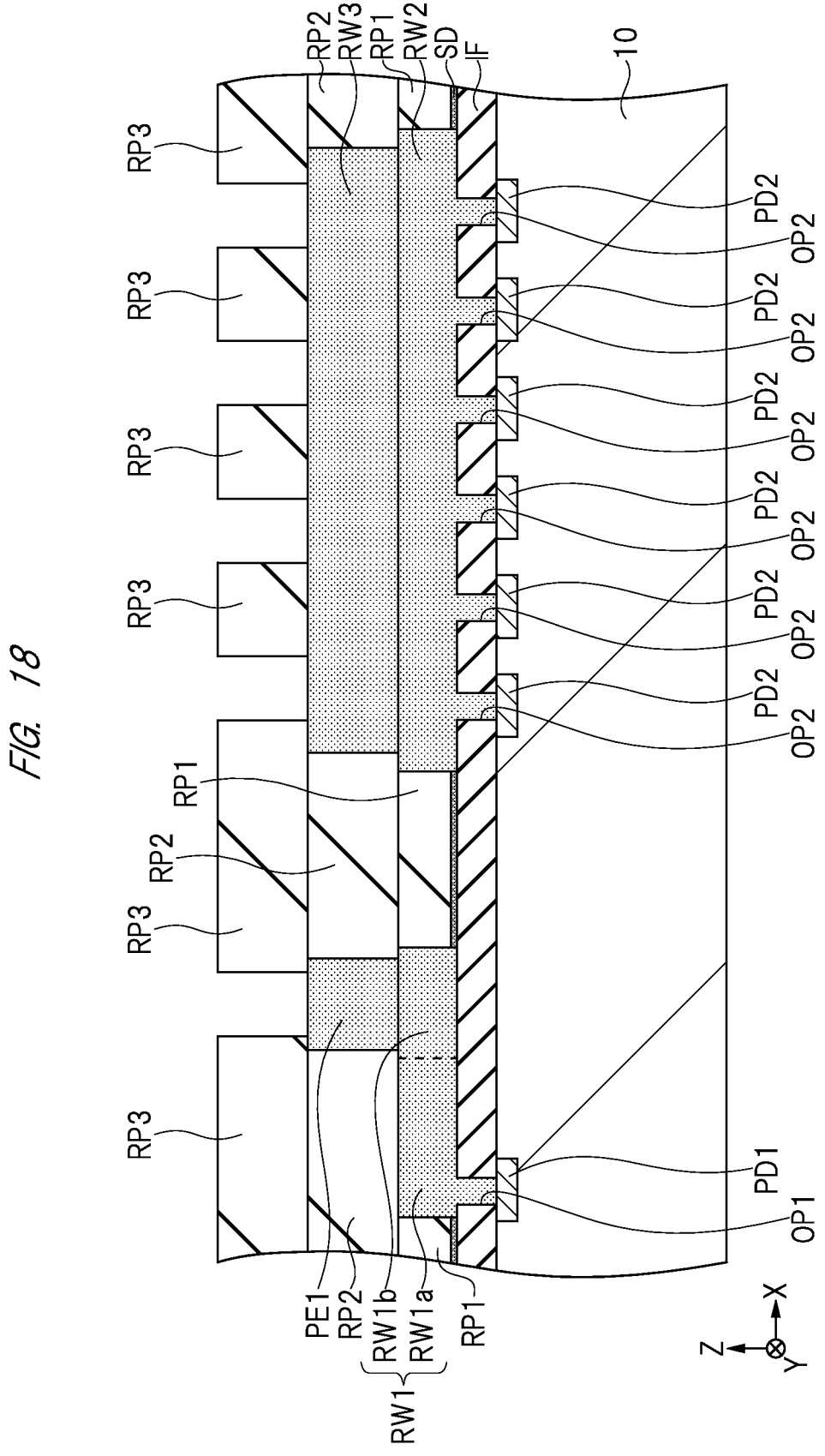
FIG. 18 is a cross-sectional view showing a manufacturing process of a semiconductor device according to the second embodiment.

As shown in FIG. 18, the resist pattern RP3 having a pattern that opens at least a part of each of the columnar electrode PE1 and the redistribution wiring RW3 is formed on the upper surfaces of the resist pattern RP2, the columnar electrode PE1, and the redistribution wiring RW3. The resist pattern RP3 is formed by forming the first resist film by the coating method and patterning the first resist film by selectively performing exposure process to the first resist film. Note that the first resist film described here is made of the same material as that used to form the resist pattern RP1 and the resist pattern RP2.

Figure 19:
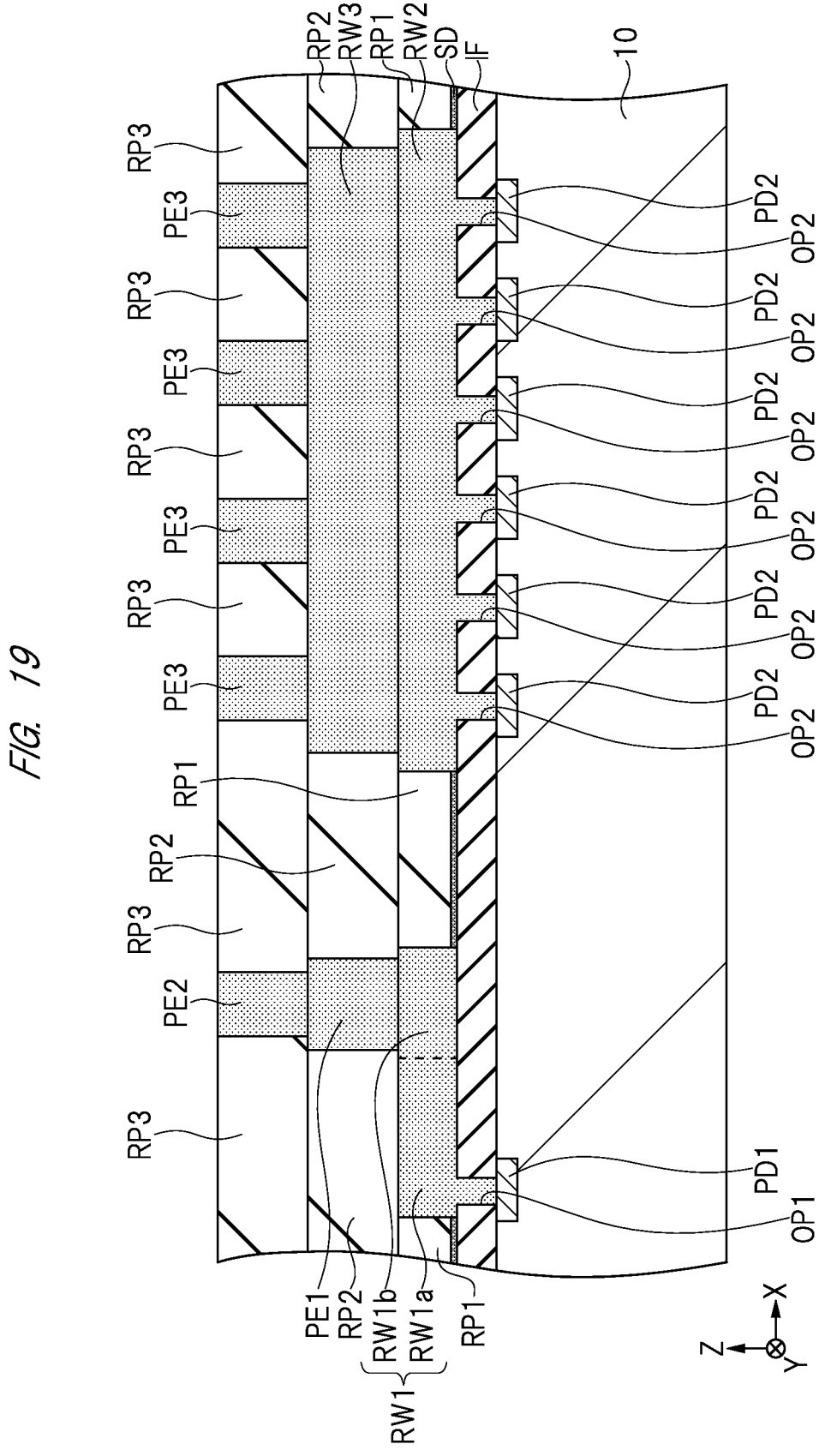
FIG. 19 is a cross-sectional view showing the manufacturing process of the semiconductor device subsequent to FIG. 18.

Next, as shown in FIG. 19, by the electroplating method, the columnar electrode PE2 is formed on the columnar electrode PE1 exposed from the resist pattern RP3, and the plurality of columnar electrodes PE3 are formed on the redistribution wiring RW3 exposed from the resist pattern RP3.

Figure 20:
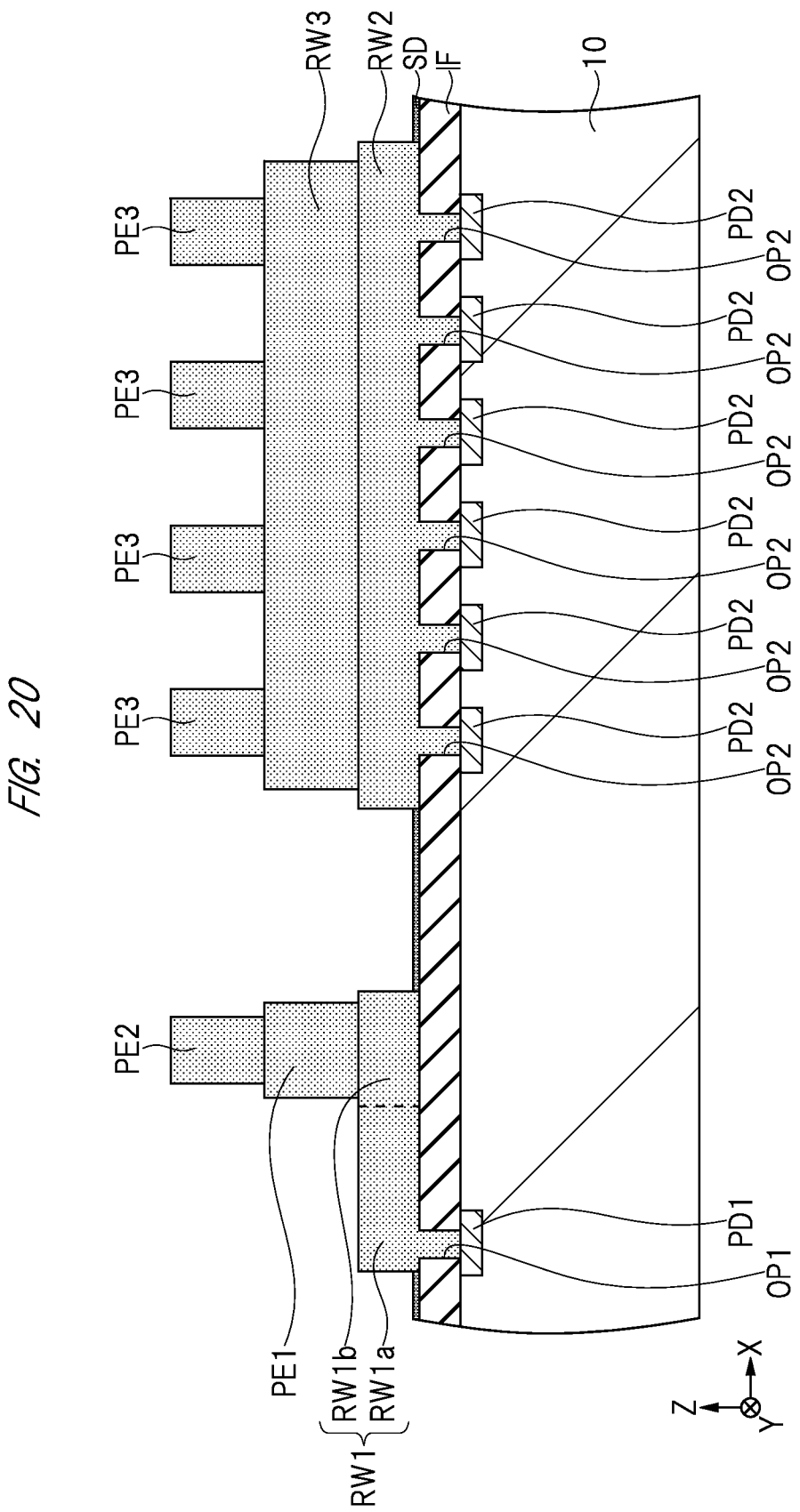
FIG. 20 is a cross-sectional view showing the manufacturing process of the semiconductor device subsequent to FIG. 19.

Next, as shown in FIG. 20, the resist pattern RP3, the resist pattern RP2, and the resist pattern RP1 are sequentially removed by, for example, the ashing process. By removing the resist pattern RP3, the resist pattern RP2, and the resist pattern RP1 in the same process, the manufacturing process can be further simplified as compared with the first embodiment.

The subsequent process is the same as that shown in FIG. 14 and following.

In the foregoing, the present invention has been specifically described based on the embodiments, but the present invention is not limited to these embodiments, and can be modified in various ways within the range not departing from the gist thereof.

The invention claimed is:

1. A semiconductor device comprising:
   a semiconductor wafer having a first pad electrode and a plurality of second pad electrodes formed on an upper surface thereof;
   an insulating film covering the first pad electrode and the plurality of second pad electrodes;
   a first opening formed in the insulating film so as to reach an upper surface of the first pad electrode;

a plurality of second openings formed in the insulating film so as to reach upper surfaces of the plurality of second pad electrodes;

a first redistribution wiring formed in the first opening and on the insulating film and electrically connected to the first pad electrode;

a first columnar electrode formed on the first redistribution wiring and having a thickness larger than that of the first redistribution wiring;

a second columnar electrode formed on the first columnar electrode and having a thickness larger than that of the first redistribution wiring;

a second redistribution wiring formed in the plurality of second openings and on the insulating film and electrically connected to the plurality of second pad electrodes;

a third redistribution wiring formed on the second redistribution wiring and having a thickness larger than that of the second redistribution wiring;

a plurality of third columnar electrodes formed on the third redistribution wiring and having a thickness larger than that of the second redistribution wiring;

a sealing resin formed on the insulating film and configured to seal the first redistribution wiring, the first columnar electrode, the second columnar electrode, the second redistribution wiring, the third redistribution wiring, and the plurality of third columnar electrodes so as to expose upper surfaces of the second columnar electrode and the plurality of third columnar electrodes; and a plurality of external connection terminals formed on the upper surfaces of the second columnar electrode and the plurality of third columnar electrodes, wherein the first redistribution wiring has a wide region for providing the first columnar electrode and the second columnar electrode and a narrow region extending from the first opening to the wide region and connecting the first pad electrode and the wide region, and wherein, in plan view, a width of the narrow region is smaller than a width of the wide region.

2. The semiconductor device according to claim 1, wherein, in plan view, the first columnar electrode and the second columnar electrode are located in a region different from the first opening, and wherein, in plan view, the plurality of third columnar electrodes are located in a region different from the plurality of second openings.

3. The semiconductor device according to claim 1, wherein the width of the narrow region in plan view is 5 μm or more and 50 μm or less, wherein the thickness of each of the first redistribution wiring and the second redistribution wiring is 1 μm or more and 10 μm or less, wherein the thickness of each of the first columnar electrode and the third redistribution wiring is 10 μm or more and 50 μm or less, and wherein the thickness of each of the second columnar electrode and the plurality of third columnar electrodes is 30 μm or more and 50 μm or less.

4. The semiconductor device according to claim 3, wherein at least two sets of the first pad electrode, the first opening, the first redistribution wiring, the first columnar electrode, and the second columnar electrode are provided, and wherein the narrow region of the first redistribution wiring of one set and the narrow region of the first redistribution wiring of the other set are adjacent to each other within a range of 5 μm or more and 50 μm or less.

5. The semiconductor device according to claim 3, wherein, in plan view, an outer periphery of the wide region includes an outer periphery of the first columnar electrode, the outer periphery of the first columnar electrode includes an outer periphery of the second columnar electrode, an outer periphery of the second redistribution wiring includes an outer periphery of the third redistribution wiring, and the outer periphery of the third redistribution wiring includes outer peripheries of the plurality of third columnar electrodes.

6. The semiconductor device according to claim 5, wherein a width of each of the second columnar electrode and the third columnar electrode in plan view is 80 μm or more and 300 μm or less.

7. The semiconductor device according to claim 1, wherein the upper surfaces of the second columnar electrode, the plurality of third columnar electrodes, and the sealing resin are flush with each other.

8. A method of manufacturing a semiconductor device comprising steps of:

(a) preparing a semiconductor wafer having a first pad electrode and a plurality of second pad electrodes formed on an upper surface thereof;

(b) after the step (a), forming an insulating film covering the first pad electrode and the plurality of second pad electrodes;

(c) after the step (b), forming, in the insulating film, a first opening reaching an upper surface of the first pad electrode and a plurality of second openings reaching upper surfaces of the plurality of second pad electrodes;

(d) after the step (c), forming a first redistribution wiring electrically connected to the first pad electrode in the first opening and on the insulating film and forming a second redistribution wiring electrically connected to the plurality of second pad electrodes in the plurality of second openings and on the insulating film;

(e) after the step (d), forming a first columnar electrode having a thickness larger than that of the first redistribution wiring on the first redistribution wiring and forming a third redistribution wiring having a thickness larger than that of the second redistribution wiring on the second redistribution wiring;

(f) after the step (e), forming a second columnar electrode having a thickness larger than that of the first redistribution wiring on the first columnar electrode and forming a plurality of third columnar electrodes having a thickness larger than that of the second redistribution wiring on the third redistribution wiring;

(g) after the step (f), sealing the first redistribution wiring, the first columnar electrode, the second columnar electrode, the second redistribution wiring, the third redistribution wiring, and the plurality of third columnar electrodes with a sealing resin on the insulating film so as to cover upper surfaces of the second columnar electrode and the plurality of third columnar electrodes;

(h) after the step (g), polishing the sealing resin to expose the upper surfaces of the second columnar electrode and the plurality of third columnar electrodes; and (i) after the step (h), forming a plurality of external connection terminals on the upper surfaces of the second columnar electrode and the plurality of third columnar electrodes, wherein the first redistribution wiring has a wide region for providing the first columnar electrode and the second columnar electrode and a narrow region extending from the first opening to the wide region and connecting the first pad electrode and the wide region, and wherein, in plan view, a width of the narrow region is smaller than a width of the wide region.

9. The method of manufacturing the semiconductor device according to claim 8, wherein the step (d) includes steps of:

(d1) forming a first resist pattern having a pattern that opens at least the first opening and the plurality of second openings on the insulating film; and (d2) after the step (d1), forming the first redistribution wiring in the first opening and on the insulating film exposed from the first resist pattern and forming the second redistribution wiring in the plurality of second openings and on the insulating film exposed from the first resist pattern, and wherein the step (e) includes steps of:

(e1) after the step (d2), forming a second resist pattern having a pattern that opens at least a part of each of the first redistribution wiring and the second redistribution wiring on upper surfaces of the first resist pattern, the first redistribution wiring, and the second redistribution wiring; and (e2) after the step (e1), forming the first columnar electrode on the first redistribution wiring exposed from the second resist pattern and forming the third redistribution wiring on the second redistribution wiring exposed from the second resist pattern.

10. The method of manufacturing the semiconductor device according to claim 9, further comprising a step of removing the second resist pattern and the first resist pattern between the step (e2) and the step (f), wherein the step (f) includes steps of:

(f1) forming a third resist pattern having a pattern that opens at least a part of each of the first columnar electrode and the third redistribution wiring on upper surfaces of the insulating film, the first columnar electrode, and the third redistribution wiring;

(f2) after the step (f1), forming the second columnar electrode on the first columnar electrode exposed from the third resist pattern and forming the plurality of third columnar electrodes on the third redistribution wiring exposed from the third resist pattern; and (f3) after the step (f2), removing the third resist pattern.

11. The method of manufacturing the semiconductor device according to claim 10, wherein each of the first resist pattern and the second resist pattern is formed by forming a first resist film by coating method and patterning the first resist film by selectively performing exposure process to the first resist film, and wherein the third resist pattern is formed by forming a second resist film by lamination method and patterning the second resist film by selectively performing exposure process to the second resist film.

12. The method of manufacturing the semiconductor device according to claim 9, wherein the step (f) includes steps of:

(f4) forming a third resist pattern having a pattern that opens at least a part of each of the first columnar electrode and the third redistribution wiring on upper surfaces of the second resist pattern, the first columnar electrode, and the third redistribution wiring;

(f5) after the step (f4), forming the second columnar electrode on the first columnar electrode exposed from the third resist pattern and forming the plurality of third columnar electrodes on the third redistribution wiring exposed from the third resist pattern; and (f6) after the step (f5), removing the third resist pattern.

13. The method of manufacturing the semiconductor device according to claim 12, wherein each of the first resist pattern, the second resist pattern, and the third resist pattern is formed by forming a first resist film by coating method and patterning the first resist film by selectively performing exposure process to the first resist film.

14. The method of manufacturing the semiconductor device according to claim 8, wherein, in plan view, the first columnar electrode and the second columnar electrode are located in a region different from the first opening, and wherein, in plan view, the plurality of third columnar electrodes are located in a region different from the plurality of second openings.

15. The method of manufacturing the semiconductor device according to claim 8, wherein the width of the narrow region in plan view is 5 μm or more and 50 μm or less, wherein the thickness of each of the first redistribution wiring and the second redistribution wiring is 1 μm or more and 10 μm or less, wherein the thickness of each of the first columnar electrode and the third redistribution wiring is 10 μm or more and 50 μm or less, and wherein the thickness of each of the second columnar electrode and the plurality of third columnar electrodes is 30 μm or more and 50 μm or less.

16. The method of manufacturing the semiconductor device according to claim 15, wherein at least two sets of the first pad electrode, the first opening, the first redistribution wiring, the first columnar electrode, and the second columnar electrode are provided, and wherein the narrow region of the first redistribution wiring of one set and the narrow region of the first redistribution wiring of the other set are adjacent to each other within a range of 5 μm or more and 50 μm or less.

17. The method of manufacturing the semiconductor device according to claim 15, wherein a current of 1 A or more and 10 A or less flows through the plurality of third columnar electrodes, the third redistribution wiring, the second redistribution wiring, and the plurality of second pad electrodes.

18. The method of manufacturing the semiconductor device according to claim 15, wherein, in plan view, an outer periphery of the wide region includes an outer periphery of the first columnar electrode, the outer periphery of the first columnar electrode includes an outer periphery of the second columnar electrode, an outer periphery of the second redistribution wiring includes an outer periphery of the third redistribution wiring, and the outer periphery of the third redistribution wiring includes outer peripheries of the plurality of third columnar electrodes.

19. The method of manufacturing the semiconductor device according to claim 18, wherein a width of each of the second columnar electrode and the third columnar electrode in plan view is 80 μm or more and 300 μm or less.

* * * * *